United States Patent
Yamazaki et al.

(10) Patent No.: US 7,687,404 B2
(45) Date of Patent: Mar. 30, 2010

(54) METHOD FOR MANUFACTURING DISPLAY DEVICE

(75) Inventors: Shunpei Yamazaki, Setagaya (JP); Hideto Ohnuma, Atsugi (JP); Mitsuaki Osame, Atsugi (JP); Aya Anzai, Tsukui (JP); Hiromichi Godo, Atsugi (JP); Tomoya Futamura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 882 days.

(21) Appl. No.: 11/121,073

(22) Filed: May 4, 2005

(65) Prior Publication Data

US 2005/0255617 A1 Nov. 17, 2005

(30) Foreign Application Priority Data

May 14, 2004 (JP) .............................. 2004-145709

(51) Int. Cl.
*H01L 21/302* (2006.01)
(52) U.S. Cl. ........................ 438/705; 438/723; 438/724; 438/153; 438/154; 438/158; 257/E21.377; 257/E21.411; 257/E21.535
(58) Field of Classification Search ................. 438/149, 438/154, 155, 164, 713, 717, 737, 738, 739, 438/756, 705, 754, 165, 151, 153, 157, 158, 438/723, 724; 257/E21.638, E21.377, E21.411, 257/E21.535
See application file for complete search history.

(56) References Cited

U.S. PATENT DOCUMENTS 5,566,009 A * 10/1996 Yamazaki et al. ............. 349/86

5,583,369 A * 12/1996 Yamazaki et al. ........... 257/635

(Continued)

FOREIGN PATENT DOCUMENTS

GB 2 286 081 8/1995

(Continued)

OTHER PUBLICATIONS

Wolf et al., Silicon Processing for the VLSI Era, vol. 1: Process Technology, 1986 by Lattice Press, pp. 532-534.*

(Continued)

*Primary Examiner*—Julio J Maldonado
(74) *Attorney, Agent, or Firm*—Eric J. Robinson; Robinson Intellectual Property Law Office, P.C.

(57) ABSTRACT

In a method for manufacturing a display device having a light emitting element, a first base insulating film, a second base insulating film, a semiconductor layer, and a gate insulating film are formed in this order over a substrate. A gate electrode is formed over the gate insulating film to overlap with at least a part of the semiconductor layer, and a portion to be a pixel portion of the gate insulating film and the second base insulating film is doped with at least one conductive type impurities. An opening portion is formed by selectively etching the gate insulating film and second base insulating film that are each doped with impurities. The first base insulating film is exposed in a bottom face of the opening portion. Subsequently, an insulating film is formed to cover the opening portion, the gate insulating film, and the gate electrode, and a light emitting element is formed over the insulating film to overlap with at least a part of the opening portion.

29 Claims, 21 Drawing Sheets

U.S. PATENT DOCUMENTS

| | | | |
|---|---|---|---|
| 5,640,067 A | | 6/1997 | Yamauchi et al. |
| 5,696,386 A | * | 12/1997 | Yamazaki .................... 257/57 |
| 5,834,327 A | | 11/1998 | Yamazaki et al. |
| 5,897,328 A | | 4/1999 | Yamauchi et al. |
| 6,160,272 A | | 12/2000 | Arai et al. |
| 6,734,463 B2 | | 5/2004 | Ishikawa |
| 6,828,726 B2 | * | 12/2004 | Sakurai et al. .............. 313/506 |
| 6,850,005 B2 | | 2/2005 | Yoneda et al. |
| 7,095,046 B2 | | 8/2006 | Ishikawa |
| 7,315,047 B2 | | 1/2008 | Kawakami et al. |
| 2002/0145142 A1 | * | 10/2002 | Chen et al. .................... 257/66 |
| 2003/0061984 A1 | | 4/2003 | Maekawa et al. |
| 2003/0116768 A1 | | 6/2003 | Ishikawa |
| 2004/0066136 A1 | | 4/2004 | Yoneda et al. |
| 2004/0082118 A1 | * | 4/2004 | Chang et al. ................ 438/154 |
| 2004/0232424 A1 | | 11/2004 | Hotta et al. |
| 2005/0145861 A1 | | 7/2005 | Kawakami et al. |
| 2005/0179372 A1 | | 8/2005 | Kawakami et al. |
| 2005/0242713 A1 | | 11/2005 | Yamazaki |
| 2005/0258443 A1 | | 11/2005 | Yamazaki et al. |

FOREIGN PATENT DOCUMENTS

| | | |
|---|---|---|
| JP | 07-211458 | 8/1995 |
| JP | 10-289784 | 10/1998 |
| JP | 2004-070351 | 3/2004 |

OTHER PUBLICATIONS

Specification, Claims, Abstract; Drawings of U.S. Appl. No. 11/121,070, filed May 4, 2005 to Yamazaki et al.

* cited by examiner

METHOD FOR MANUFACTURING DISPLAY DEVICE

BACKGROUND OF THE INVENTION

1. Field of the Invention

The present invention relates to a method for manufacturing an active-matrix display device. More specifically, the invention relates to a method for forming a structure of a part for extracting luminescence generated from a light emitting element in a display device having the light emitting element.

2. Description of the Related Art

A display device using luminescence generated from an electroluminescence element (a light emitting element) has drawn attention as a display device with a high viewing angle and low power consumption.

A driving method of a display device mainly used for displaying includes ones of an active-matrix type and a passive-matrix type. In a display device using the active-matrix-type driving method, emission state, non-emission state, or the like can be controlled per a light emitting element. Therefore, the active-matrix display device can be driven in lower power consumption than a passive-matrix display device; accordingly, it is suitable for a display portion of a large-sized display such as a television receiver as well as a display portion of a small-sized one such as a portable phone.

In addition, in the active-matrix display device, a circuit for controlling driving of each light emitting element is provided in each light emitting element. The circuit and the light emitting element are disposed over a substrate so that the circuit does not prevent luminescence from being extracted outside. Light-transmitting insulating layers are stacked in a portion overlapping the light emitting element, and luminescent is emitted outside through the insulating layer. The insulating layers are disposed in order to form a circuit element such as a transistor or a capacitor element which is a component of a circuit or to form a wiring.

In some cases, a multiple interaction of luminescence may occur due to the difference in a refractive index of each insulating layer when the luminescence passes through the stacked insulating layers. As a result, an emission spectrum varies depending on an angle to a light emitting surface, thereby causing deterioration in visibility of an image displayed in a display device.

In addition, the deterioration in visibility of an image due to the difference in a refractive index of each layer also occurs in a passive-matrix display device. For example, Patent Document 1: Japanese Patent Laid-Open No. Hei7-211458 raises a problem in which the deterioration in visibility is caused since external light and luminescence are reflected at an interface due to the difference in a refractive index of each layer which constitutes a part of a light emitting element. Patent Document 1 also suggests a light emitting element with a devised element structure capable of solving the above problem.

SUMMARY OF THE INVENTION

The invention provides a method for manufacturing a display device in which variations in an emission spectrum depending on an angle to a surface through which luminescence is emitted are reduced.

In a method for manufacturing a display device having a light emitting element, a first base insulating film, a second base insulating film, a semiconductor layer, and a gate insulating film are formed in this order over a substrate. A gate electrode is formed over the gate insulating film to overlap with at least a part of the semiconductor layer, and a portion to be a pixel portion in the gate insulating film and the second base insulating film is doped with at least one conductive type impurity. An opening portion is formed by selectively etching the gate insulating film and second base insulating film that are each doped with impurity. The first base insulating film is exposed in a bottom face of the opening portion. Subsequently, an insulating film is formed to cover the opening portion, the gate insulating film, and the gate electrode, and a light emitting element is formed over the insulating film to overlap with at least a part of the opening portion.

According to the method for manufacturing a display device of the invention, a display device in which variations in an emission spectrum depending on an angle to a surface through which luminescence is emitted are reduced may be obtained with high throughput.

In addition, according to the method for manufacturing a display device of the invention, a display device which provides an image in which variations in an emission spectrum depending on an angle to a side from which luminescence is extracted are reduced may be obtained with high throughput.

DETAILED DESCRIPTION OF THE INVENTION

Embodiment modes of the invention are hereinafter described with reference to drawings. It is to be understood by those of skilled in the art that the invention can be applied in various modes, and the mode and the detail can be variously changed unless it departs from the content and the scope of the invention. Therefore, the invention is not limited to the description of this embodiment mode. In addition, structures to be described hereinafter can be suitably combined with each other to be used.

Embodiment Mode 1

A method for manufacturing a display device according to the invention is described with reference to FIGS. 1A to 1E.

Figure 1A:
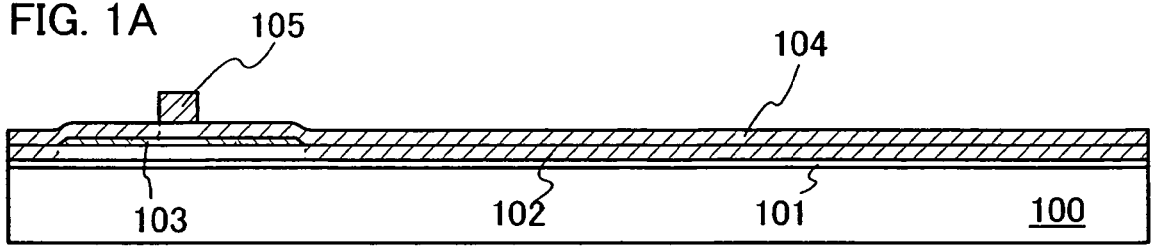
FIGS. 1A to 1E are diagrams showing steps for manufacturing a display device.

A base insulating film 101 is formed over a substrate 100, a second base insulating film 102 is formed there over, and further, a semiconductor layer is formed over the second base insulating film (FIG. 1A).

Light transmitting glass, quartz, plastic (such as polyimide, acrylic, polyethylene terephthalate, polycarbonate, polyacrylate, or polyethersulfone), or the like can be used as a material of the substrate 100. The substrate may be used after being polished by CMP or the like, if necessary. In this embodiment mode, a glass substrate is used.

The first base insulating film 101 and the second base insulating film 102 are provided in order to prevent an impurity element (ion) which imparts an adverse effect on the properties of a semiconductor layer, such as an alkali metal or an alkaline earth metal in the substrate 100, from diffusing into the semiconductor layer. It is founded that a silicon nitride based (in the invention, it means silicon nitride, silicon oxynitride (atomic number, N>O) and a mixture including a small amount of dopant or impurity thereinto) film has a profound block-effect of the impurity element (ion). A silicon oxide based (in the invention, it means silicon oxide, silicon oxynitride (atomic number, O>N) and a mixture including a small amount of dopant or impurity thereinto) film has an advantage over a silicon nitride based film, because the silicon oxide based film has a larger band gap, more excellent insulation, and a lower trap level than the silicon nitride film.

Thus, in this embodiment mode, a base insulating film includes two layers of the first base insulating film 101 and the second base insulating film 102. Note that the first base insulating film 101 is formed of silicon nitride including oxygen of 50 nm thick, and the second base insulating film 102 is formed of silicon oxide including nitrogen of 100 nm thick. The base insulating film has a structure in which a high blocking effect of an impurity element (ion) and reliability of a thin film transistor may be simultaneously obtained.

The subsequently formed semiconductor layer is obtained by performing laser crystallization on an amorphous silicon film in this embodiment mode. An amorphous silicon film is formed to have a film thickness of 25 to 100 nm (preferably, 30 to 60 nm in thickness) over the second base insulating film 102. A known method such as a sputtering method, a low pressure CVD method, or a plasma CVD method can be used as the manufacturing method. Subsequently, the amorphous silicon film is heat-treated at a temperature of 500° C. for one hour for dehydrogenation.

Then, the amorphous silicon film is crystallized with the use of a laser irradiation apparatus to form a crystalline silicon film. As the laser crystallization in this embodiment mode, an excimer laser is used, and an emitted laser beam is processed to have a linear beam spot with an optical system. The amorphous silicon film is irradiated therewith to be a crystalline silicon film, as is used as the semiconductor layer.

As another method for crystallizing an amorphous silicon film, there are a crystallizing method only by heat treatment, a crystallizing method by heat treatment with the use of a catalytic element which promotes crystallization, and the like. Nickel, iron, palladium, tin, lead, cobalt, platinum, copper, gold, or the like can be used as the element which promotes crystallization. By using such an element, crystallization can be performed at a lower temperature in a shorter time, compared to the case of performing crystallization only by heat treatment. Therefore, a glass substrate or the like is less damaged. In the case of performing crystallization only by heat treatment, a highly heat resistant quartz substrate or the like may to be used as the substrate 100.

Subsequently, addition of very small numbers of impurities, so-called channel doping, is performed on the semiconductor layer to control a threshold value, if necessary. An N type or P type impurity element (phosphorus, boron, or the like) is added by an ion doping method or the like to obtain a required threshold value.

Thereafter, the semiconductor layer is patterned to have a predetermined shape as shown in FIG. 1A, thereby obtaining a desired-shaped semiconductor layer 103. A photoresist is applied to the semiconductor layer, exposed to light, and baked to form a resist mask having a predetermined shape over the semiconductor layer. Etching is performed using the mask. In this manner, the patterning is performed.

A gate insulating film 104 is formed so as to cover the semiconductor layer 103. The gate insulating film 104 is formed of an insulating film containing silicon by a plasma CVD method or a sputtering method. The film thickness may be 40 to 150 mn. In this embodiment mode, the gate insulating film 104 is formed of silicon oxide including nitrogen of 100 nm. In addition, in this embodiment mode, the gate insulating film 104 is formed to have a single layer, however, it may be formed to have two or more layers. In this case, a material of a lamination of the gate insulating film 104 may be selected appropriately; however, a layer on a side being in contact with the semiconductor layer 103 is preferably formed of silicon oxide based material for the same reason as the base insulating film. For example, when a gate insulating film includes a lamination of a silicon oxide based film and a silicon nitride based film, it is preferable that a silicon oxide based material is stacked in direct contact with a semiconductor layer and a silicon nitride based film is stacked thereover. Some materials (Mo and the like) of the gate electrode deteriorate since it is in contact with an oxide film. Therefore, in the case of forming a gate electrode by such a material, the gate electrode may be operated with stability by using a silicon nitride based film as a gate insulating film on a side being in contact with the gate electrode.

Subsequently, a gate electrode 105 is formed over the gate insulating film 104. The gate electrode 105 may be formed using an element of Ta, W, Ti, Mo, Al, Cu, Cr, or Nd, or using an alloy material or compound material which mainly contains the element. A semiconductor layer typified by a polycrystalline silicon film doped with impurity element such as phosphorus may be used. Alternatively, an alloy including Ag, Pd, and Cu may be used. In this embodiment mode, the gate electrode 105 is formed using Mo as the material to be a single layer.

The gate electrode 105 may be formed to have a single layer or to have two or more layers. In addition, in this embodiment mode, the gate electrode 105 has a rectangular section; however the cross-sectional shape thereof is not limited to it. For example, the cross sectional shape may be a trapezoid or like a hat. Etching is performed using a mask of a photoresist to process the gate electrode 105.

Figure 1B:
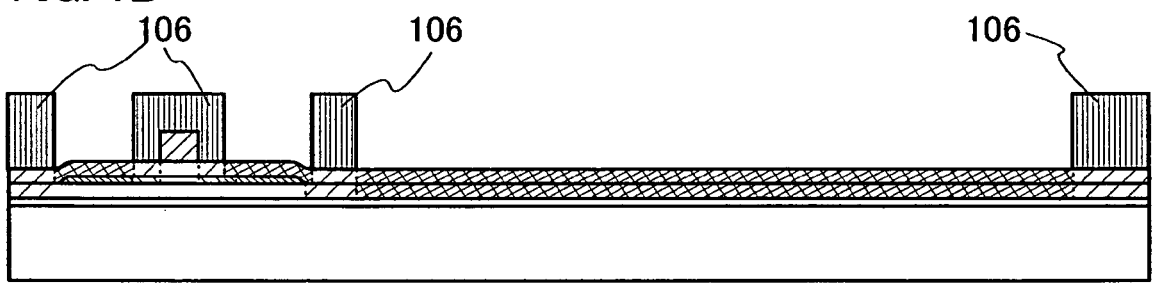

Subsequently, the semiconductor layer 103 is doped with an impurity element (boron, in this embodiment mode) imparting a one conductive type thereto using the gate electrode 105 as a mask, and simultaneously, the gate insulating film 104 and the second base insulating film 102 are also doped with impurities. At this time, the first base insulating film 101 is not doped with impurities (FIG. 1B).

A mask 106 having a portion to be a heavily doped impurity region in the semiconductor layer 103 and a portion to be a light path of luminescence generated from a light emitting element which are opened, is formed with a photoresist or the like, and doping with impurities is conducted thereto again. Thus, a heavily doped impurity region and a lightly doped impurity region are formed in the semiconductor layer 103. In addition, a portion to be a light path of luminescence generated from a light emitting element in the gate insulating film 104 and the second base insulating film 102 is also heavily doped with impurities.

Note that an impurity element typified by phosphorus, arsenic, and the like, as well as boron may be used as impurities imparting a one conductive type. In this embodiment mode, the semiconductor layer is doped with only boron, since the semiconductor layer 103 is used as a driving transistor for driving a light emitting element. However, in the case of forming a semiconductor layer having another conductive type over the same substrate, the portion to be a light path of luminescence produced from a light emitting element is preferably doped with impurities several times. Note that in some cases, the semiconductor layer may be doped with phosphorus, even when the semiconductor layer is used as a driving transistor for driving a light emitting element.

Figure 1C:
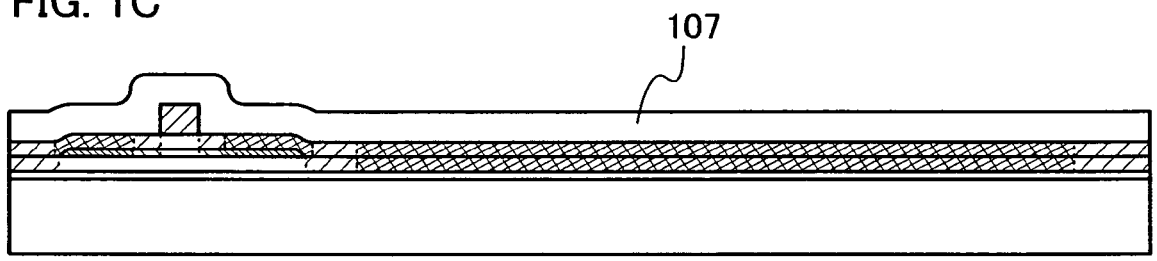

Next, the mask 106 is removed, and thus, a first interlayer insulating film 107 is formed to cover the gate electrode 105 and the gate insulating film 104. The first interlayer insulating film 107 is formed of an organic or inorganic material. In this embodiment mode, the first interlayer insulating film 107 is formed of a silicon oxide film including nitrogen (FIG. 1C).

Figure 1D:
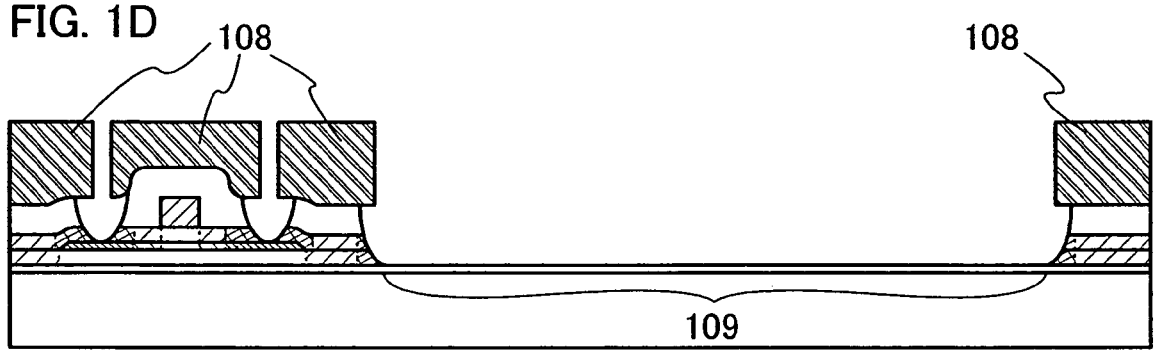

Subsequently, by using a mask 108 with a photoresist or the like, a contact hole reaching the semiconductor layer 103 is formed in the first interlayer insulating film 107 and the gate insulating film 104; simultaneously, each portion to be a light path of luminescence generated from a light emitting element in the first interlayer insulating film 107, the gate insulating film 104, and the second base insulating film 102 is removed to form an opening portion 109. Wet-etching is used with a hydrofluoric acid based chemical for the etching, and diluted hydrofluoric acid, buffered hydrogen fluoride, or the like can be used. In this embodiment mode, a diluted hydrofluoric acid of 0.5% is used for the etching (FIG. 1D).

Luminescence generated from a light emitting element passes through several layers in a display device to be extracted out of the display device. Here, if each layer has different refractive index, a multiple interaction of luminescence may occur due to reflection or refraction in each interface. This causes a standing wave, thereby changing a color tone in viewing a light emitting surface of a display device from various angles, in other words, viewing angle dependency is generated. Thus, deterioration in quality of display of a display device is caused.

Thus, the opening portion 109 is formed in a portion to be a light path of luminescence of a light emitting element in order to decrease the number of films through which luminescence generated from a light emitting element passes to be extracted out of the display device. Therefore, a multiple interaction of luminescence due to reflection, refraction, or the like enables probability of causing a standing wave to be greatly reduced.

The portion to be a light path of luminescence produced from a light emitting element in the gate insulating film 104 and the second base insulating film 102 has been heavily doped with impurities; therefore, it is etched at higher speed compared to the case where the second base insulating film 102 is not doped with impurities. However, the first base insulating film 101 has not been doped with impurities; therefore, it is etched at normal speed. The etching speed can be changed by approximately twice or three times, depending on the amount or kind of impurities. The first base insulating film 101 can efficiently function as an etching stopper when etching to form the opening portion 109. As described above, the base insulating film is provided in order to prevent an impurity element (ion) from diffusing from a substrate causing adversely effect. Therefore, the base insulating film preferably remains, even after the opening portion 109 is formed. The manufacturing method according to the invention enables the base insulating film to remain certainly and with ease.

In addition, doping with impurities is conducted in conjunction with doping the semiconductor layer with impurities in the invention. Then, as in this embodiment mode, the opening portion 109 is formed in conjunction with forming the contact hole; therefore, the number of steps and masks is not increased.

Figure 1E:
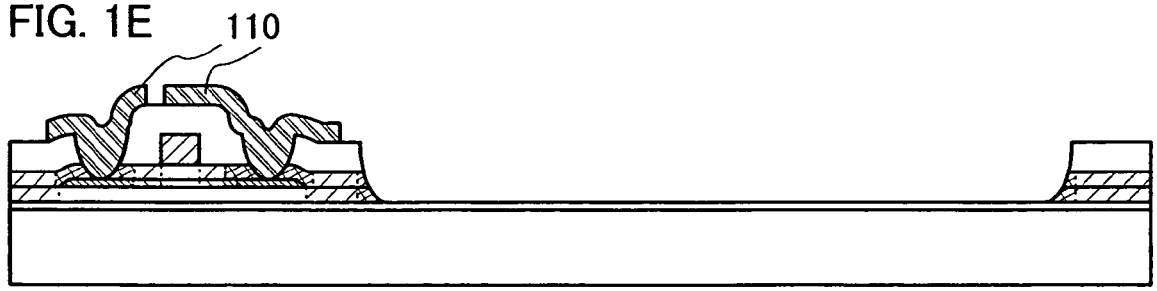

Subsequently, a wiring 110 is formed to be in contact with the semiconductor layer 103 through a contact hole. A conductive layer for covering the contact hole and the first interlayer insulating film 107 is formed and processed to have a desired shape, thereby forming the wiring 110. It may be formed to be a single layer of aluminum, copper, molybdenum, or the like; however, in this embodiment mode, it is formed to have a structure of molybdenum, aluminum, and molybdenum stacked in this order from a substrate side. As the laminated wiring, a structure of titanium, aluminum, and titanium stacked in this order, or a structure of titanium, titanium nitride, aluminum, and titanium stacked in this order, or both laminated structures using aluminum mixed with silicon in the above laminations may be used. The processing of the conductive layer may be conducted by dry-etching or wet-etching using a resist (FIG. 1E).

Figure 2A:
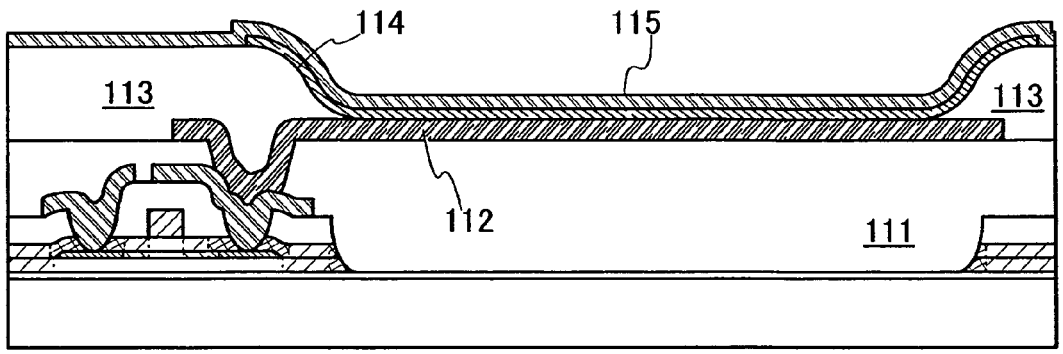
FIGS. 2A to 2D are diagrams showing steps for manufacturing a display device.

Next, a second interlayer insulating film 111 is formed to cover the first interlayer insulating film 107, the opening portion 109, and the wiring 110. The second interlayer insulating film 111 may be formed of an organic or inorganic insulating material; however, it is preferably formed of a film having self-flatness, since depressions of a lower layer can be reduced, thereby enhancing numerical aperture. In this embodiment mode, a material known as siloxane which has a skeleton formed of the bond of silicon and oxygen and an organic group containing at least hydrogen, such as an alkyl group or aromatic hydrocarbon, or a fluoro group may be used as the substituent. As another material, acryl, polyimide, or the like can be used (FIG. 2A).

A contact hole reaching the wiring 110 is formed in the second interlayer insulating film 111. The contact hole may be formed using a mask of a resist or the like by wet-etching or dry-etching. In this embodiment mode, dry-etching is used to form the contact hole.

The contact hole is formed, then, a first electrode 112 of a light emitting element is formed. The first electrode 112 may be formed by forming a light transmitting conductive film to cover the second interlayer insulating film 111 and the contact hole and by etching the light transmitting conductive film using a mask of a resist or the like. As the material of the first electrode 112, indium tin oxide (ITO), indium tin oxide including silicon oxide (ITSO), indium zinc oxide (IZO) prepared by mixing zinc oxide of 2 to 20% into indium oxide, zinc oxide it self, gallium zinc oxide (GZO) prepared by mixing gallium into zinc oxide, or the like can be used. In this embodiment mode, ITSO is formed by a sputtering method and dry-etching is conducted to form the first electrode 112.

Next, an insulating film is formed of an organic or inorganic material to cover the second interlayer insulating film 111 and the first electrode 112. Subsequently, the insulating film is processed to cover an edge of the first electrode 112 and to expose a part of the first electrode 112, thereby forming a bank 113. The bank 113 is preferably formed of a photosensitive organic material (acrylic, polyimide, or the like), but may be formed of a non-photosensitive organic material or inorganic material. In this embodiment mode, photosensitive polyimide is used. An end face of the bank 113, facing the first electrode 112 has preferably curvature, and further preferably, has a tapered shape in which the curvature continuously changes. Note that the bank 113 may be mixed with a black material such as a pigment or carbon, and may be used as a black matrix.

A light emitting layer 114 is formed to cover an exposed portion of the first electrode 112 which is not covered with the bank 113. The light emitting layer 114 may be formed by any of an evaporation method, an ink-jet method, a spin coating method, and the like. Subsequently, a second electrode 115 is formed to cover the light emitting layer 114. Thus, a light emitting element including the first electrode 112, the light emitting layer 114, and the second electrode 115 can be manufactured.

A silicon oxide film containing nitrogen may be formed as a passivation film by a plasma CVD method. In the case of using the silicon oxide film containing nitrogen, a silicon oxynitride film formed from $SiH_4$, $N_2O$, and $NH_3$, a silicon oxynitride film formed from $SiH_4$ and $N_2O$, or a silicon oxynitride film formed from a gas in which $SiH_4$ and $N_2O$ are diluted with Ar may be formed by a plasma CVD method.

A silicon oxynitride hydride film formed from $SiH_4$, $N_2O$, and $H_2$ may be used as the passivation film. Naturally, the structure of the passivation film is not limited to a single layer structure. The passivation film may have a single layer structure or laminated structure of another insulating layer containing silicon. In addition, a multilayer film of a carbon nitride film and a silicon nitride film, a multilayer film of styrene polymer, a silicon nitride film, or a diamond like carbon film may be substituted for the silicon oxide film containing nitrogen.

Then, a display portion is sealed. In the case of using an opposing substrate for sealing, the opposing substrate is attached by using an insulating sealing member so that an external connection portion is exposed. A depression may be formed on the opposing substrate, and a drying agent may be attached thereto. A space between the opposing substrate and the substrate over which elements are formed may be filled with a dry inert gas such as nitrogen, or the opposing substrate may be formed by entirely applying a sealing member to the pixel portion. It is preferable to use an ultraviolet curing resin or the like as the sealing member. The sealing member may be mixed with a drying agent or particles for keeping a gap constant. Then, a display device is completed by attaching a flexible wiring board to an external connection portion.

Note that either an analog video signal or a digital video signal may be used for a light emitting display device of the invention having a display function. In the case of using the digital video signal, the video signal can be divided into a video signal using voltage and a video signal using current. A video signal, inputted to a pixel when luminescence is generated from a light emitting element, includes a constant voltage video signal and a constant current video signal. The constant voltage video signal includes a signal in which voltage applied to a light emitting element is constant and a signal in which current applied to a light emitting element is constant. The constant current video signal includes a signal in which voltage applied to a light emitting element is constant and a signal in which current applied to a light emitting element is constant. Drive with the signal in which voltage applied to a light emitting element is constant is constant voltage drive, and that with the signal in which current applied to a light emitting element is constant is constant current drive. By constant current drive, constant current is applied to a light emitting element, regardless of a change in resistance of the light emitting element. For a display device of the invention and a driving method thereof, either a driving method using voltage of a video signal or a driving method using current of a video signal may be used, and either constant voltage drive or constant current drive may be used.

Hereinabove, a method for manufacturing a display device in this embodiment mode of the invention is described. The display device formed by the manufacturing method described in this embodiment mode has the opening portion 109, thereby decreasing the number of films through which luminescence generated from a light emitting element passes to be extracted out of the display device. Therefore, a multiple interaction of luminescence due to reflection, refraction, or the like enables probability of causing a standing way to be greatly reduced.

The portion to be a light path of luminescence produced from a light emitting element in the gate insulating film 104 and the second base insulating film 102 has been heavily doped with impurities; therefore, it is etched at higher speed compared to the case where the second base insulating film 102 is not doped with impurities. However, the first base insulating film 101 has not been doped with impurities; therefore, it is etched at normal speed. The etching speed can be changed by approximately twice or three times, depending on the amount or kind of impurities. The first base insulating film 101 can efficiently function as an etching stopper when etching to form the opening portion 109. As described above, the base insulating film is provided in order to prevent an impurity element (ion) from diffusing from a substrate and causing an adversely effect. Therefore, the base insulating film preferably remains, even after the opening portion 109 is formed. The manufacturing method according to the invention enables the base insulating film to remain certainly and with ease.

In addition, the invention has several variations, the kind, shape, and material of the thin film transistor can be changed, without limiting to the above description. The laminated structure may have several structures. Only some examples are shown below.

Figure 2B:
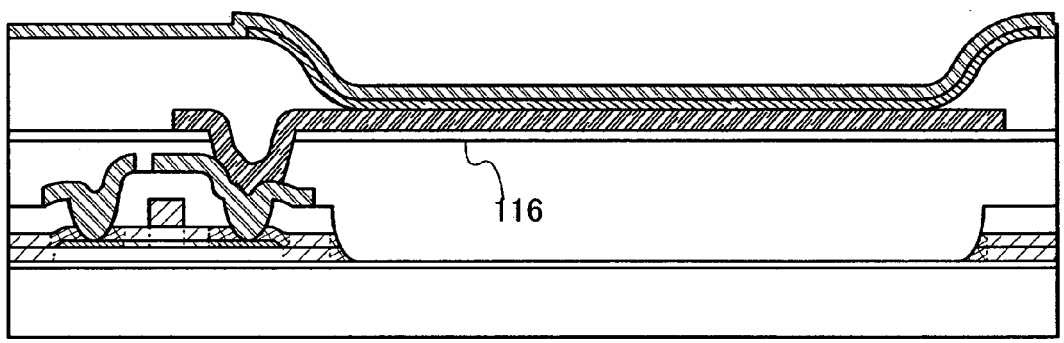

FIG. 2B shows a structure in which an etching stopper film 116 is provided between the second interlayer insulating film 111 and the first electrode 112. The etching stopper film 116 is mainly formed of a silicon nitride based film and prevents the second interlayer insulating film 111 from being etched in etching to form the first electrode 112. The etching stopper film 116 is formed after the second interlayer insulating film 111 is formed, and a contact hole is formed in the etching stopper film 116 in conjunction with forming a contact hole in the second interlayer insulating film 111. The other steps are the same, therefore, and thus, are omitted.

Figure 2C:
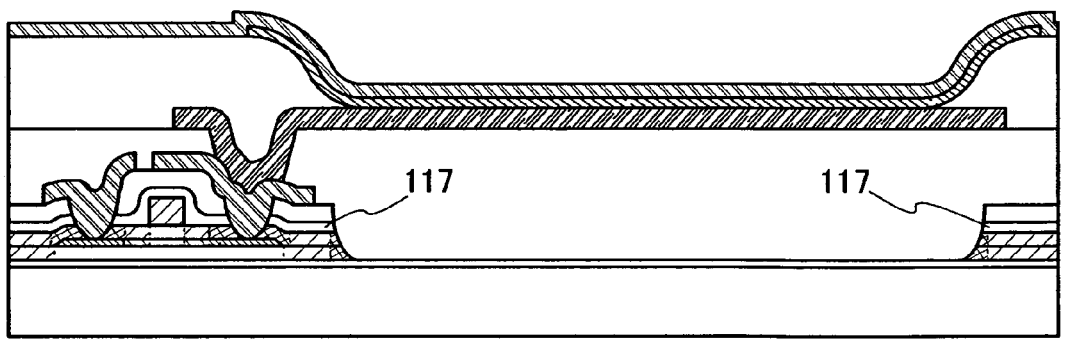

FIG. 2C shows a structure in which a silicon nitride based film is provided between the gate insulating film 104 or the gate electrode 105 and the first interlayer insulating film 107. The silicon nitride based film operates to prevent impurities (ion) from entering the semiconductor layer 103 and to hydrogenate the semiconductor layer 103 by thermally exciting hydrogen contained therein to terminate a dangling bond. The silicon nitride based film is expediently referred to as a hydrogenation film 117. The hydrogenation film 117 also operates to prevent the gate electrode 105 from being oxidized when the gate electrode 105 is formed of a material such as molybdenum, which is oxidized by contacting an oxide film and an interlayer insulating film is formed of silicon oxide to be connected thereto.

The hydrogenation film 117 is formed of a silicon nitride based film after the gate electrode 105 is formed, and may be formed by each CVD method. Subsequently, heat treatment is conducted in the case of hydrogenate the semiconductor layer 103; however, hydrogen treatment can be conducted in conjunction with baking siloxane in the case of forming the first interlayer insulating film 107 by siloxane. The other steps are the same, therefore, and thus, are omitted.

Figure 2D:
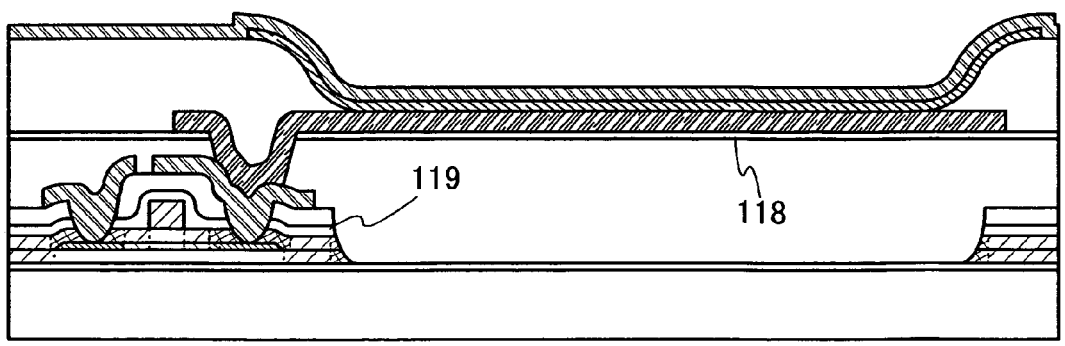

FIG. 2D shows a structure in which both an etching stopper film 118 and a hydrogenation film 119 are provided. The manufacturing method and the others are the same as those in FIGS. 2A to 2C, and thus, are omitted.

Figure 3A:
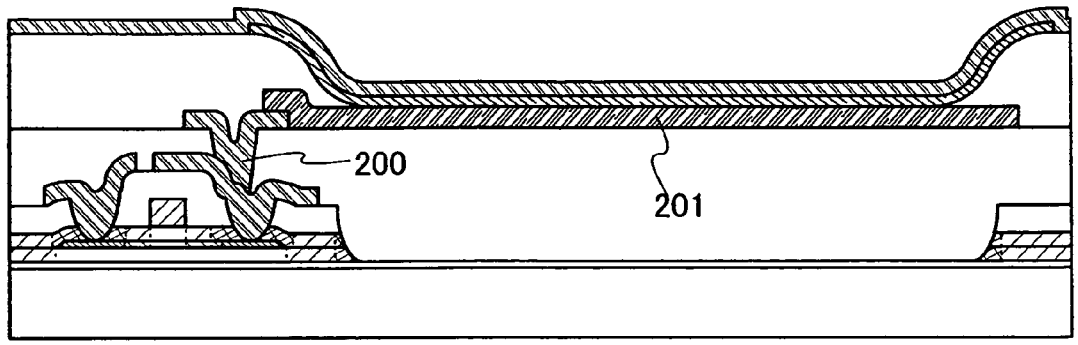
FIGS. 3A to 3D are diagrams showing steps for manufacturing a display device.

The structure in FIG. 3A is the same as that in FIG. 2A. However, in FIG. 3A, the wiring 110 is not directly connected to the transparent conductive film to be used as the first electrode 112 of a light emitting element through the contact hole; but, a second wiring 200 is connected to the wiring 110 and a first electrode 201 of the light emitting element is formed of the transparent conductive film to be partly in contact with the second wiring 200.

As for the manufacturing method, a contact hole to be connected to the wiring 110 is formed in the second interlayer insulating film 111, and subsequently, a conductive film is formed to cover the second interlayer insulating film 111 and the contact hole. The conductive film may be formed from Al, Cu, Mo, or Ti, may be formed to be a single layer of another metal, or may be formed to have a laminated structure thereof.

Then, the second wiring 200 is formed by etching the conductive film. Dry-etching or wet-etching is conducted using a mask of a resist or the like. A transparent conductive film is formed to cover the second interlayer insulating film 111 and the second wiring 200. As a material of the transparent conductive film, as described above, indium tin oxide (ITO), indium tin oxide including silicon oxide (ITSO), indium zinc oxide (IZO) prepared by mixing zinc oxide of 2 to 20% into indium oxide, zinc oxide it self, gallium zinc oxide (GZO) prepared by mixing gallium into zinc oxide, an AL-Ni alloy, a material prepared by mixing carbon into an AL-Ni alloy, or the like can be used. In this embodiment mode, ITSO is formed by a sputtering method and dry-etching is conducted to form the first electrode 201. The other steps are the same as those in FIG. 2A, and thus, are omitted.

Figure 3B:
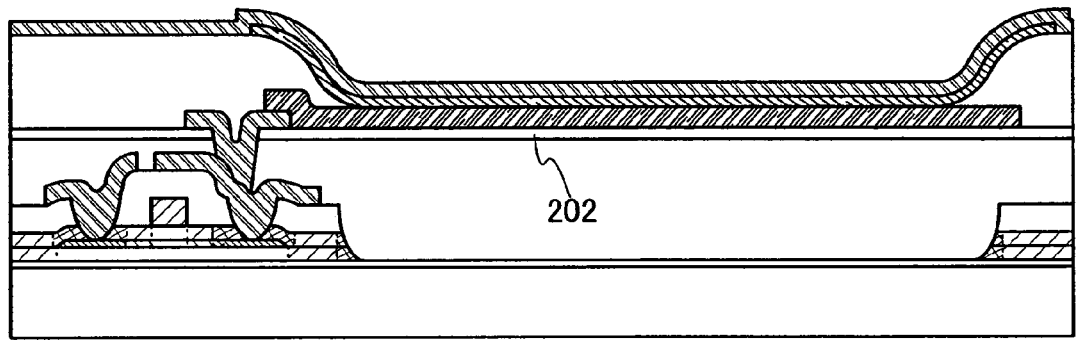

FIG. 3B shows a structure in which an etching stopper film 202 is provided in the structure in FIG. 3A. For the etching stopper film 202, reference is made to the description of FIG. 2B. The other steps are the same as those in FIG. 3A.

Figure 3C:
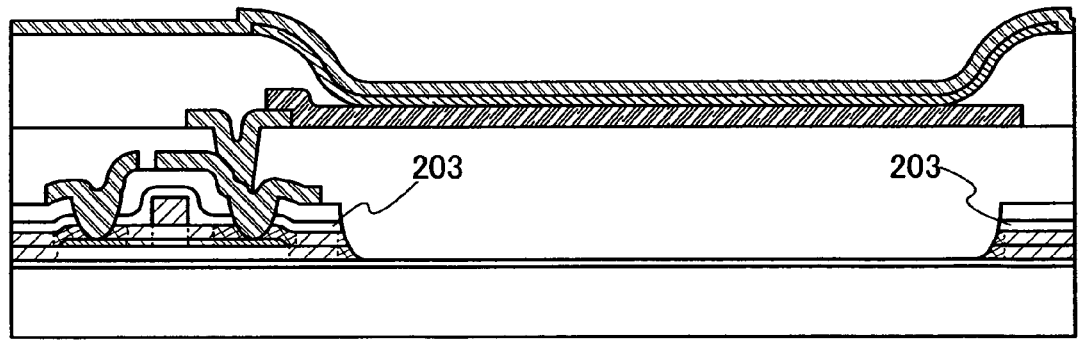

FIG. 3C shows a structure in which a hydrogenation film 203 is provided in the structure in FIG. 3A. For the hydrogenation film 203, reference is made to the description of FIG. 2C. The other steps are the same as those in FIG. 3A.

Figure 3D:
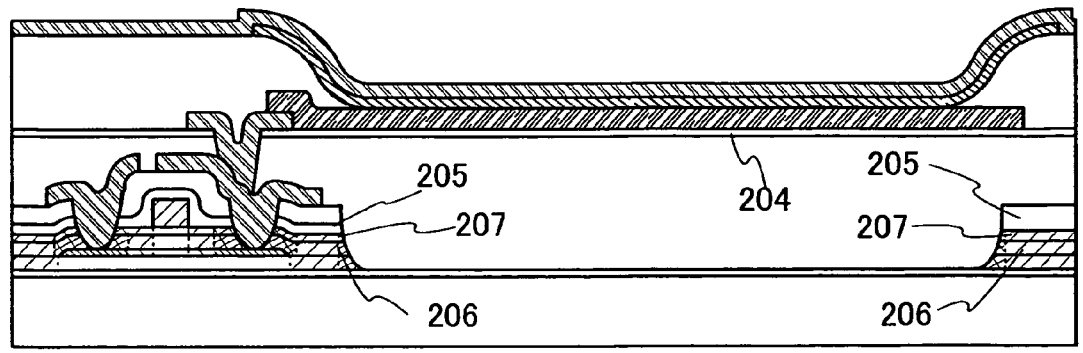

FIG. 3D shows a structure in which an etching stopper film 204 and a hydrogenation film 205 are provided in the structure in FIG. 3A and gate insulating films are formed to have two layers. A first gate insulating film 206 and a second gate insulating film 207 may be each formed of different insulating films including silicon. The first gate insulating film 206 which is formed in contact with the semiconductor layer 103 is formed of a silicon oxide based material and the second gate insulating film 207 which is formed in contact with the gate electrode 105 is formed of a silicon nitride based material. Therefore, even a material such as molybdenum, which is oxidized in being formed over an oxide film, can be used with stability as the gate electrode 105. In addition, since the first gate insulating film 206 which is formed in contact with the semiconductor layer 103 is formed of a silicon oxide based material, a trap level is lower and a formed thin film transistor can operate with stability. The silicon nitride based film and the silicon oxide film may be formed by a known method, such as each CVD method or a sputtering method. For the other steps, an effect, and the others, reference is made to the descriptions of FIGS. 3A to 3C.

Figure 4A:
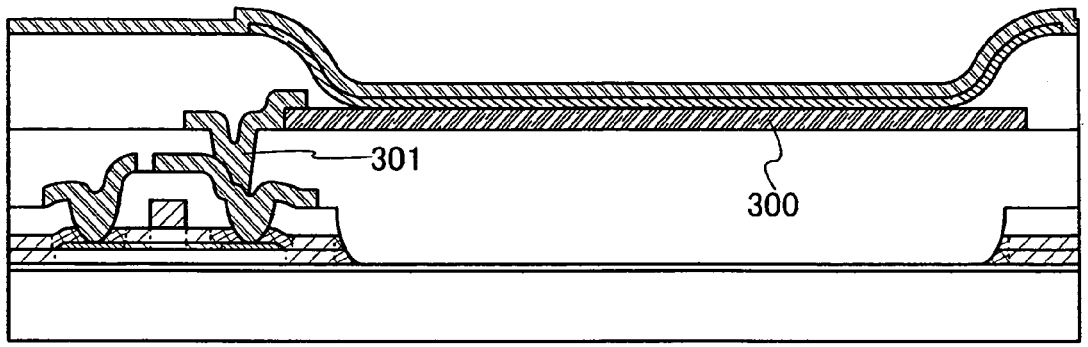
FIGS. 4A to 4D are diagrams showing steps for manufacturing a display device.

FIG. 4A shows the same structure as in FIG. 3A. However, in FIG. 4A, a first electrode 300 of a light emitting element is formed before forming a second wiring 301. The other steps are the same as those in FIG. 3A, and thus, are omitted.

Figure 4B:
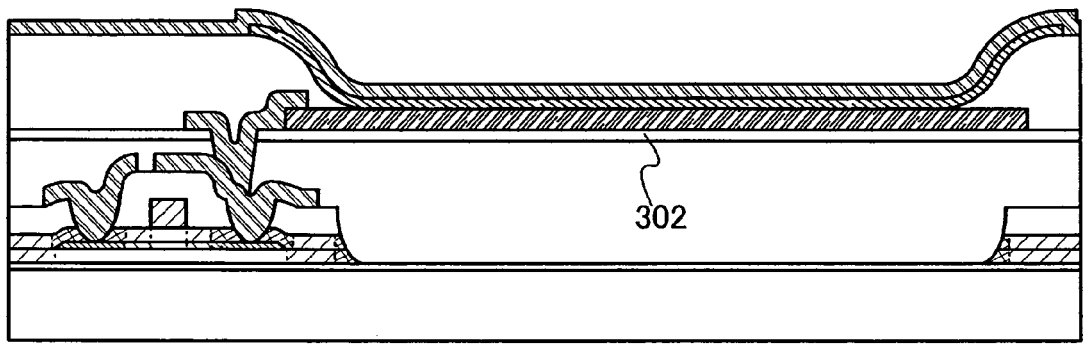

FIG. 4B shows a structure in which an etching stopper film 302 is provided in the structure in FIG. 4A. For the etching stopper film 302, reference is made to the description of FIG. 2B. The other steps are the same as those in FIG. 4A.

Figure 4C:
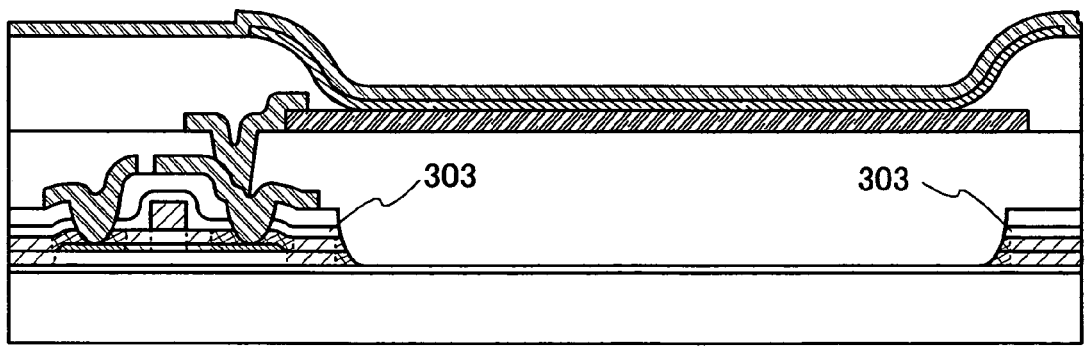

FIG. 4C shows a structure in which a hydrogenation film 303 is provided in the structure in FIG. 4A. For the hydrogenation film 303, reference is made to the description of FIG. 2C. The other steps are the same as those in FIG. 4A.

Figure 4D:
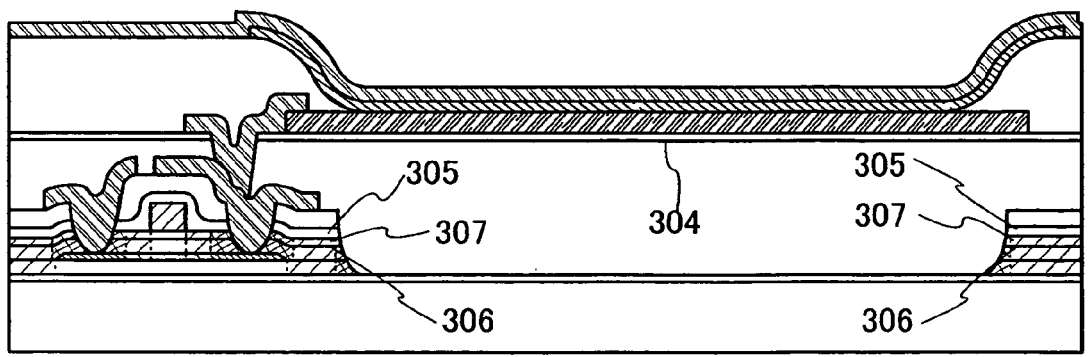

FIG. 4D shows a structure in which an etching stopper film 304 and a hydrogenation film 305 are provided in the structure in FIG. 4A and gate insulating films are formed to have two layers. A first gate insulating film 306 and a second gate insulating film 307 may be each formed of different insulating films including silicon. The first gate insulating film 306 which is formed in contact with the semiconductor layer 103 is formed of a silicon oxide based material and the second gate insulating film 307 which is formed in contact with the gate electrode 105 is formed of a silicon nitride based material. Therefore, even a material such as molybdenum, which is oxidized in being formed over an oxide film, can be used with stability as the gate electrode 105. In addition, since the first gate insulating film 306 which is formed in contact with the semiconductor layer 103 is formed of a silicon oxide based material, a trap level is lower and a formed thin film transistor can operate with stability. The silicon nitride based film and the silicon oxide film may be formed by a known method, such as each CVD method or a sputtering method. For the other steps, an effect, and the others, reference is made to the descriptions of FIGS. 4A to 4C.

Embodiment Mode 2

Figure 5A:
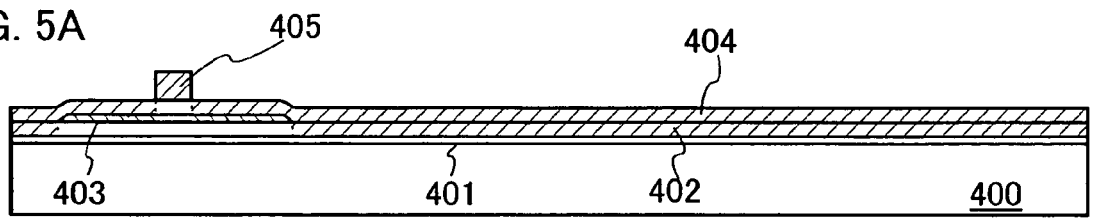
FIGS. 5A to 5E are diagrams showing steps for manufacturing a display device.
Figure 5B:
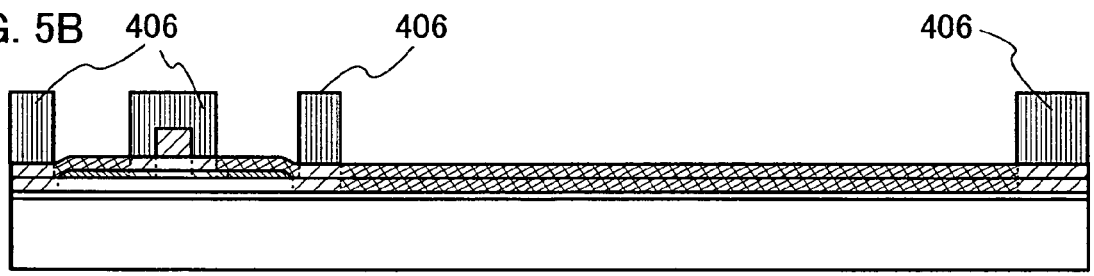
Figure 5C:
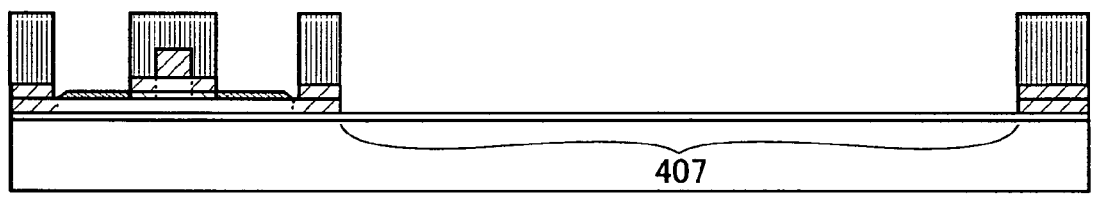

A method for manufacturing a display device according to the invention is described with reference to FIGS. 5A to 5E. A first base insulating film 401, a second base insulating film 402, a semiconductor layer 403, a gate insulating film 404, and a gate electrode 405 are formed over a substrate 400. Lightly doping with impurities is conducted thereto. Then, a mask 406 is formed. Subsequently, a portion to be a heavily doped impurity region in the semiconductor layer 403 and a portion to be a light path of luminescence generated from a light emitting element in the gate insulating film 404 and the second base insulating film 402 is heavily doped with impurities. Steps up to this point are the same as those in FIGS. 1A and 1B; therefore, the description is omitted. Reference is made to the descriptions of FIGS. 1A and 1B (FIGS. 5A and 5B).

After the above described doping with impurities, an opening portion 407 is formed in a portion to be a light path of luminescence generated from a light emitting element in the gate insulating film 404 and the second base insulating film 402, without removing the mask 406. Wet-etching is used with a hydrofluoric acid based chemical for etching, and diluted hydrofluoric acid, buffered hydrogen fluoride, or the like can be used. In this embodiment mode, diluted hydrofluoric acid of 0.5% is used for etching (FIGS. 5A and 5B).

Luminescence generated from a light emitting element passes through several layers in a display device to be extracted out of the display device. Here, if each layer has different refractive index, a multiple interaction of luminescence may occur due to reflection or refraction in each interface. This causes a standing wave, thereby changing a color tone in viewing a light emitting surface of a display device from various angles, in other words, viewing angle dependency is generated. It has caused deterioration in quality of display of a display device. Thus, the opening portion 407 is formed in a portion to be a light path of luminescence of a light emitting element in order to decrease the number of films through which luminescence generated from a light emitting element passes to be extracted out of the display device. Therefore, a multiple interaction of luminescence due to reflection, refraction, or the like enables probability of causing a standing wave to be greatly reduced.

The portion to be a light path of luminescence produced from a light emitting element in the gate insulating film 404 and the second base insulating film 402 has been heavily doped with impurities; therefore, it is etched at higher speed compared to the case where the second base insulating film 402 is not doped with impurities. However, the first base insulating film 401 has not been doped with impurities; therefore, it is etched at normal speed. The etching speed can be changed by approximately twice or three times, depending on the amount or kind of impurities. The first base insulating film 401 can substantially function as an etching stopper when etching to form the opening portion 407. As described above, the base insulating film is provided in order to prevent an impurity element (ion) from diffusing from a substrate causing adversely effect. Therefore, the base insulating film preferably remains, even after the opening portion 407 is formed. The manufacturing method according to the invention enables the base insulating film to remain certainly and with ease.

Figure 5D:
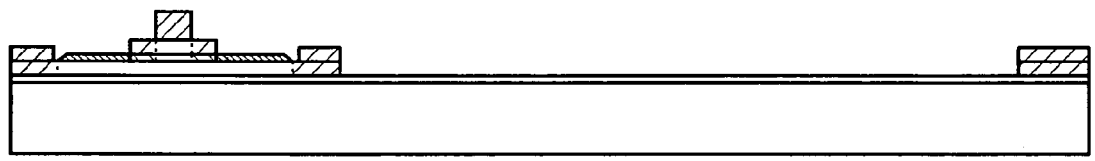
Figure 5E:
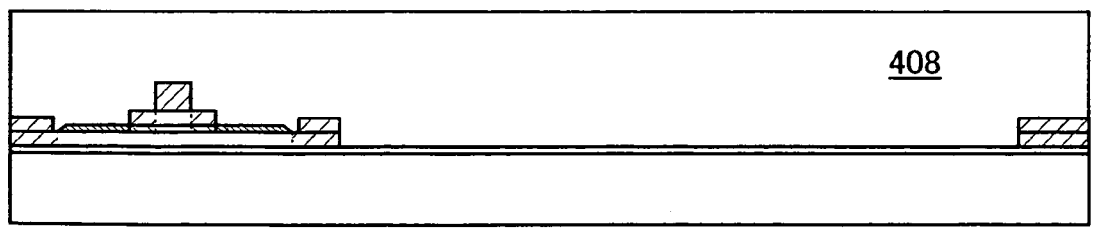

Subsequently, the mask 406 is removed and an interlayer insulating film 408 is formed (FIGS. 5D and 5E). The interlayer insulating film 408 may be formed of an organic or inorganic insulating material; however, it is preferable formed of a material having self-flatness, since depressions of a lower layer can be reduced, thereby enhancing aperture ratio. In this embodiment mode, siloxane is used to form the interlayer insulating film 408. As another material, acryl, polyimide, or the like, which has self-flatness, can be used.

Figure 6A:
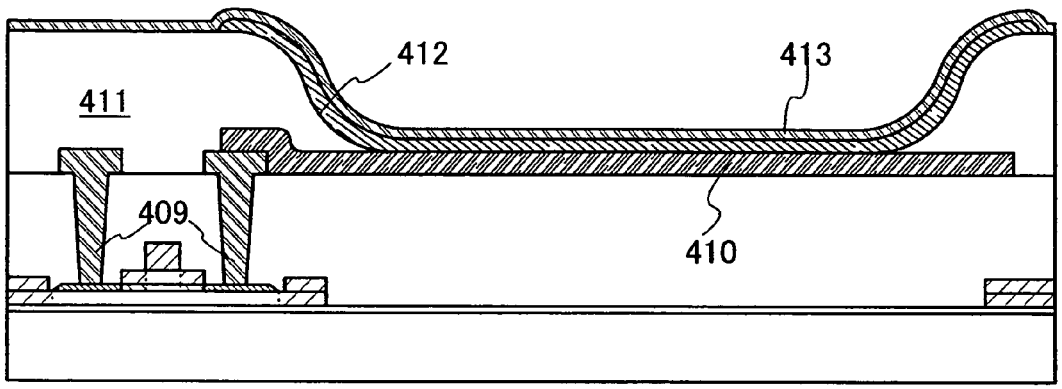
FIGS. 6A to 6D are diagrams showing steps for manufacturing a display device.

Next, a contact hole is formed in the interlayer insulating film 408, and a wiring 409 is formed to be in contact with the semiconductor layer 403 through the contact hole. The contact hole is formed using a resist or the like as a mask by dry-etching or wet-etching. A conductive layer for covering the contact hole and the first interlayer insulating film 408 is formed and processed to have a desired shape, thereby forming the wiring 409. It may be formed to be a single layer of aluminum, copper, molybdenum, or the like; however, in this embodiment mode, it is formed to have a structure of molybdenum, aluminum, molybdenum stacked in this order. As the laminated wiring, a structure of titanium, aluminum, and titanium stacked in this order, or a structure of titanium, titanium nitride, aluminum, and titanium stacked in this order, or both structures using aluminum mixed with silicon in the above laminations may be used. The processing of the conductive layer may be conducted by dry-etching or wet-etching using a resist (FIG. 6A).

A first electrode 410 of a light emitting element is formed. The first electrode 410 may be formed by forming a light transmitting conductive film to cover the interlayer insulating film 408 and the wiring 409 and by etching using a mask of a resist or the like. As the material of the first electrode 410, indium tin oxide (ITO), indium tin oxide including silicon oxide (ITSO), indium zinc oxide (IZO) prepared by mixing zinc oxide of 2 to 20% into indium oxide, zinc oxide it self, gallium zinc oxide (GZO) prepared by mixing gallium into zinc oxide, or the like can be used. In this embodiment mode, ITSO is formed by a sputtering method and dry-etching is conducted to form the first electrode 410.

Next, an insulating film is formed of an organic or inorganic material to cover the interlayer insulating film 408 and the first electrode 410. Subsequently, the insulating film is processed to cover an edge of the first electrode 410 and to expose a part of the first electrode 410, thereby forming a bank 411. The bank 411 is preferably formed of a photosensitive organic material (acrylic, polyimide, or the like), but may be formed of a non-photosensitive organic material or inorganic material. In this embodiment mode, photosensitive polyimide is used. An end face of the bank 411, facing the first electrode 410, preferably has curvature, and further preferably, has a tapered shape in which the curvature continuously changes. Note that the bank 411 may be mixed with a black material such as a pigment or carbon, and may be used as a black matrix.

A light emitting layer 412 is formed to cover an exposed portion of the first electrode 410 which is not covered with the bank 411. The light emitting layer 412 may be formed by any of an evaporation method, an ink-jet method, a spin coating method, and the like. Subsequently, a second electrode 413 is formed to cover the light emitting layer 412. Thus, a light emitting element including the first electrode 410, the light emitting layer 412, and the second electrode 413 can be manufactured.

A silicon oxide film containing nitrogen may be formed as a passivation film by a plasma CVD method. In the case of using the silicon oxide film containing nitrogen, a silicon oxynitride film formed from $SiH_4$, $N_2O$, and $NH_3$, a silicon oxynitride film formed from $SiH_4$ and $N_2O$, or a silicon oxynitride film formed from a gas in which $SiH_4$ and $N_2O$ are diluted with Ar may be formed by a plasma CVD method.

A silicon oxynitride hydride film formed from $SiH_4$, $N_2O$, and $H_2$ may be used as the passivation film. Naturally, the structure of the passivation film is not limited to a single layer structure. The passivation film may have a single layer structure or laminated structure of another insulating layer containing silicon. In addition, a multilayer film of a carbon nitride film and a silicon nitride film, a multilayer film of styrene polymer, a silicon nitride film, or a diamond like carbon film may be substituted for the silicon oxide film containing nitrogen.

Then, a display portion is sealed. In the case of using an opposing substrate for sealing, the opposing substrate is attached by using an insulating sealing member so that an external connection portion is exposed. A depression may be formed on the opposing substrate, and a drying agent may be attached thereto. A space between the opposing substrate and the substrate over which elements are formed may be filled with a dry inert gas such as nitrogen, or the opposing substrate may be formed by entirely applying a sealing member to the pixel portion. It is preferable to use an ultraviolet curing resin or the like as the sealing member. The sealing member may be mixed with a drying agent or particles for keeping a gap constant. Then, a display device is completed by attaching a flexible wiring board to an external connection portion.

Note that either an analog video signal or a digital video signal may be used for a light emitting display device of the invention having a display function. In the case of using the digital video signal, the video signal can be divided into a video signal using voltage and a video signal using current. A video signal, inputted to a pixel when luminescence is generated from a light emitting element, includes a constant voltage video signal and a constant current video signal. The constant voltage video signal includes a signal in which voltage applied to a light emitting element is constant and a signal in which current applied to a light emitting element is constant. The constant current video signal includes a signal in which voltage applied to a light emitting element is constant and a signal in which current applied to a light emitting element is constant. Drive with the signal in which voltage applied to a light emitting element is constant is constant voltage drive, and that with the signal in which current applied to a light emitting element is constant is constant current drive. By constant current drive, constant current is applied to a light emitting element, regardless of a change in resistance of the light emitting element. For a display device of the invention and a driving method thereof, either a driving method using voltage of a video signal or a driving method using current of a video signal may be used, and either constant voltage drive or constant current drive may be used.

Hereinabove, a method for manufacturing a display device in this embodiment mode of the invention is described. The display device formed by the manufacturing method described in this embodiment mode has the opening portion 407, thereby decreasing the number of films through which luminescence generated from a light emitting element passes to be extracted out of the display device. Therefore, multiple light interferences due to reflection, refraction, or the like enable probability of causing a standing way to be greatly reduced.

The portion to be a light path of luminescence generated from a light emitting element in the gate insulating film 404 and the second base insulating film 402 is heavily doped with impurities; therefore, it is etched at higher speed compared to the case where the second base insulating film 402 is not doped with impurities. However, the first base insulating film 401 is not doped with impurities; therefore, it is etched at normal speed. The etching speed can be changed by approximately two or three times, depending on amount or kind of impurities. The first base insulating film 401 can substantially function as an etching stopper in etching and forming the opening portion 407. As described above, the base insulating film is provided in order to prevent an impurity element (ion) from diffusing from a substrate and causing an adverse effect. Therefore, the base insulating film preferably remains, even after the opening portion 407 is formed. The manufacturing method according to the invention enables the base insulating film to certainly and easily to remain.

In addition, the invention has several variations, the kind, shape, and material of the thin film transistor can be changed, without limiting to the above description. The laminated structure may have several structures. Only some examples are shown below.

FIG. 2B shows a structure in which an etching stopper film 414 is provided between the interlayer insulating film 408 and the first electrode 410. The etching stopper film 414 is mainly formed of a silicon nitride based film and prevents the interlayer insulating film 408 from being etched in etching to form the first electrode 410. The etching stopper film 414 is formed after the interlayer insulating film 408 is formed, and a contact hole is formed in the etching stopper film 414 in conjunction with forming a contact hole in the interlayer insulating film 408. The other steps are the same as those in FIG. 6A, and thus, are omitted.

Figure 6B:
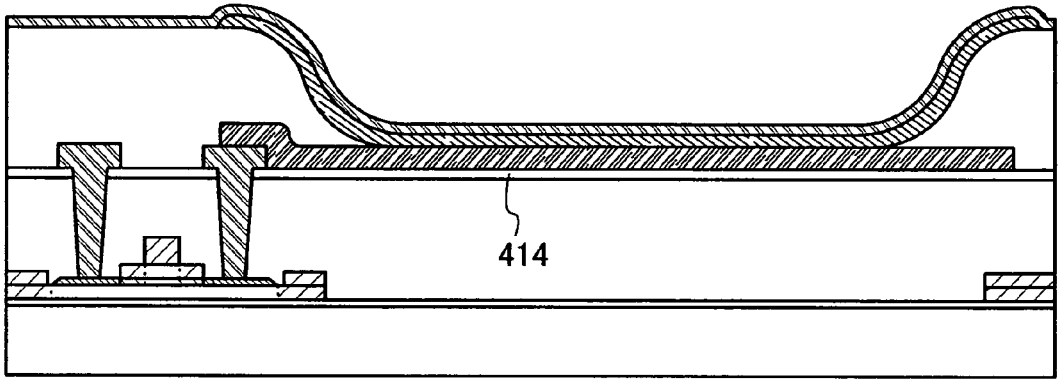
Figure 6C:
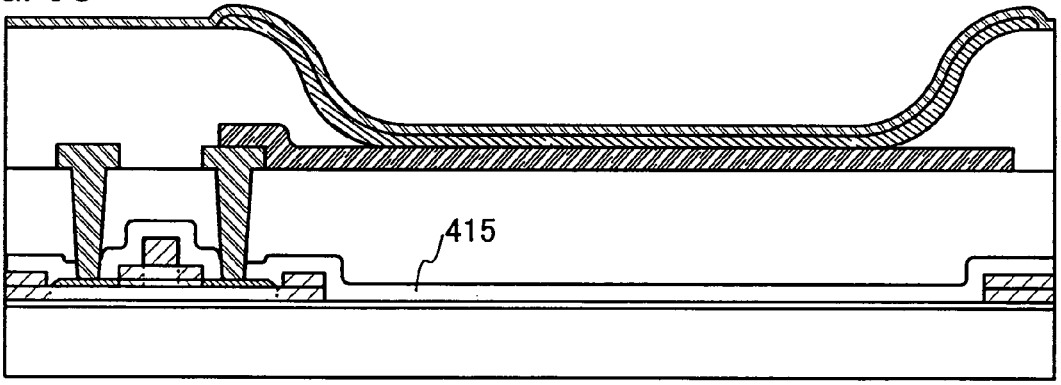

FIG. 6C shows a structure in which a silicon nitride based hydrogenation film 415 is provided between the gate insulating film 404 or the gate electrode 405 and the interlayer insulating film 408. The hydrogenation film operates to prevent impurities (ion) from entering the semiconductor layer 403 and to hydrogenate the semiconductor layer 403 by thermally exciting hydrogen contained therein to terminate a dangling bond. The hydrogenation film 415 is formed of a silicon nitride based film after the gate electrode 405 is formed, and may be formed by each CVD method. Subsequently, heat treatment is conducted in the case of hydrogenate the semiconductor layer 403; however, hydrogen treatment can be conducted in conjunction with baking siloxane in the case of forming the interlayer insulating film 408 by siloxane. The other steps are the same as those in FIG. 6B, and thus, are omitted.

Figure 6D:
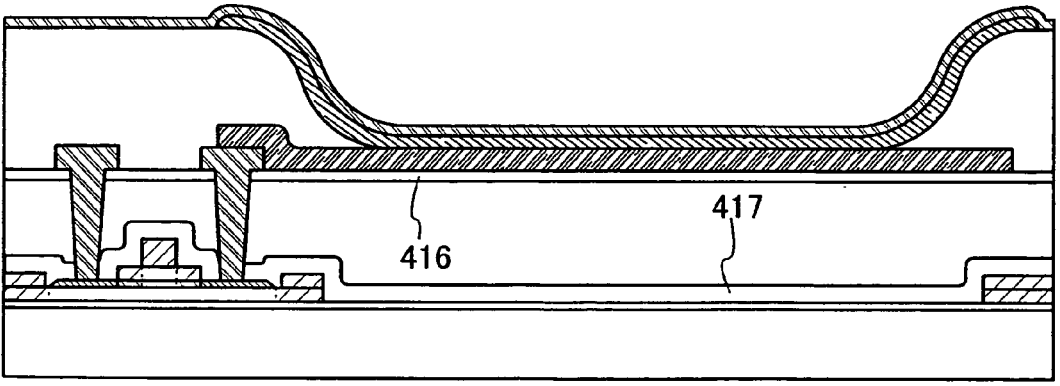

FIG. 6D shows a structure in which both an etching stopper film 416 and a hydrogenation film 417 are provided. The manufacturing method and the others are the same as those in FIGS. 6A to 6C, and thus, are omitted.

Figure 7A:
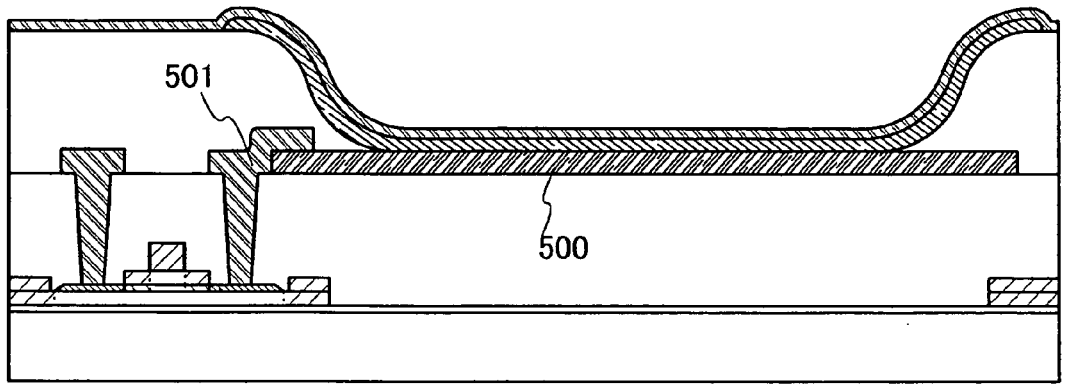
FIGS. 7A to 7D are diagrams showing steps for manufacturing a display device.

FIG. 7A shows the same structure as in FIG. 6A; however, s first electrode 500 of a light emitting element is formed before forming a wiring 501. In other words, the interlayer insulating film 408 is formed, then, a transparent conductive film is formed before forming the wiring 409, thereby forming the first electrode 500 by etching. A contact hole may be formed either before and after the first electrode 500 is formed. The other steps are the same as those in FIG. 6A, and thus, are omitted.

Figure 7B:
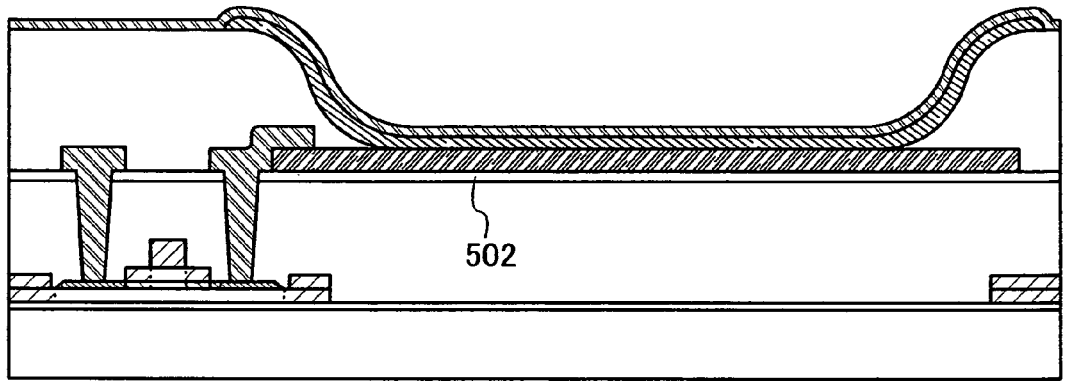

FIG. 7B shows a structure in which an etching stopper film 502 is provided in the structure in FIG. 7A. For the etching stopper film 502, reference is made to the description of FIG. 2B. The other steps are the same as those in FIG. 7A.

Figure 7C:
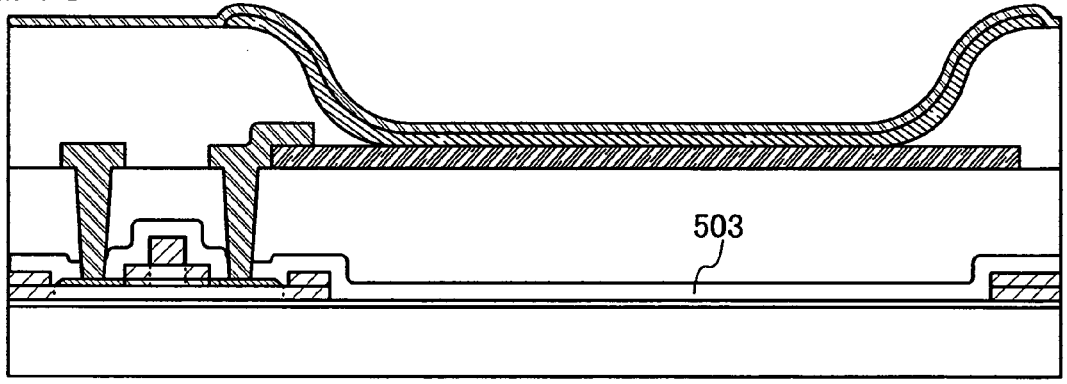

FIG. 7C shows a structure in which a hydrogenation film 503 is provided in the structure in FIG. 7A. For the hydrogenation film 503, reference is made to the description of FIG. 2C. The other steps are the same as those in FIG. 7A.

Figure 7D:
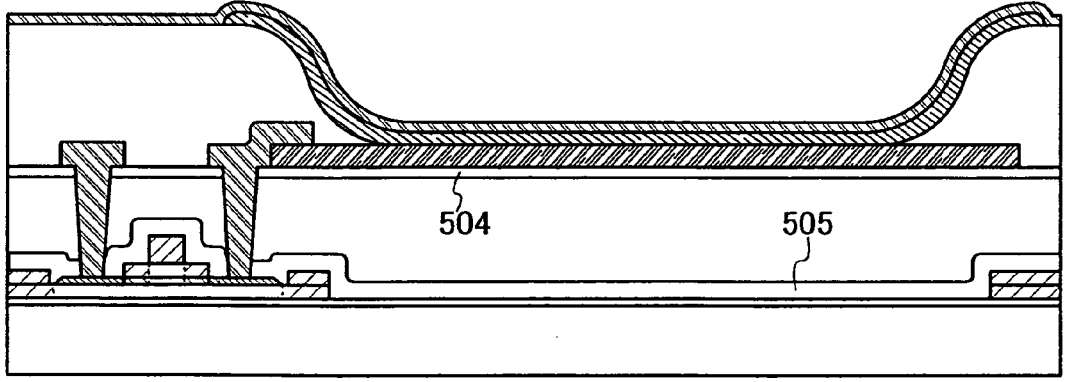

FIG. 7D shows a structure in which both an etching stopper film 504 and a hydrogenation film 505 are provided in the structure in FIG. 7A. For the manufacturing method and the others, reference is made to the descriptions of FIGS. 7A to 7C.

Embodiment Mode 3

Figure 8A:
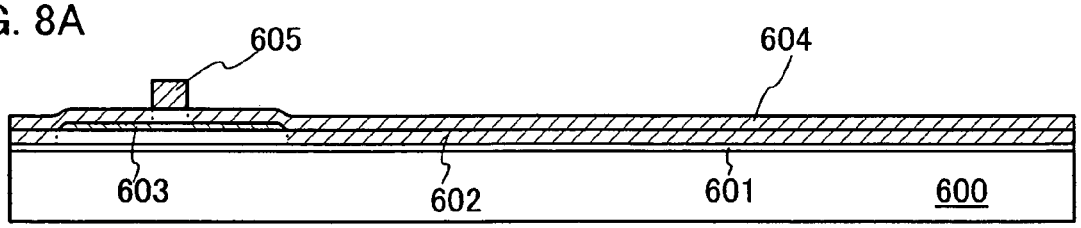
FIGS. 8A to 8E are diagrams showing steps for manufacturing a display device.
Figure 8B:
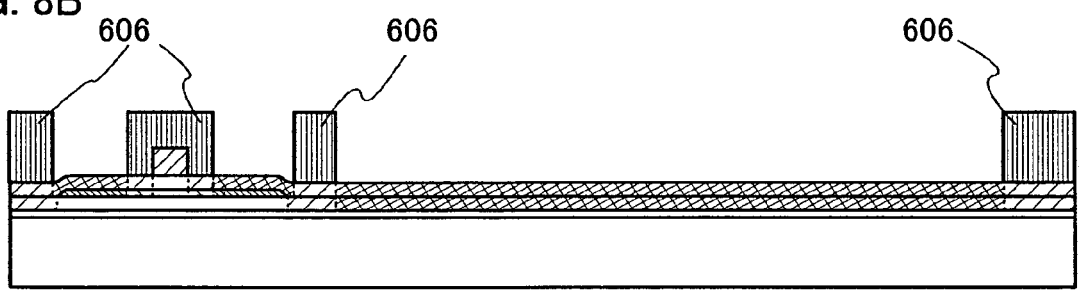

A method for manufacturing a display device according to the invention is described with reference to FIGS. 8A to 8E. A first base insulating film 601, a second base insulating film 602, a semiconductor layer 603, a gate insulating film 604, and a gate electrode 605 are formed over a substrate 600. Lightly doping with impurities is conducted thereto. Then, a mask 606 is formed. Subsequently, each portion to be a heavily doped impurity region, that is, each portion of the semiconductor layer 603, the gate insulating film 604, and the second base insulating film 602, to be a light path of luminescence generated from a light emitting element is heavily doped with impurities. Steps up to this point are the same as those in FIGS. 1A and 1B; therefore, the description is omitted. Reference is made to the descriptions of FIGS. 1A and 1B (FIGS. 8A and 8B).

After the above described doping with impurities, the mask 606 is removed. An opening portion 607 is formed in a portion to be a light path of luminescence generated from a light emitting element in the gate insulating film 604 and the second base insulating film 602. Wet-etching is used with a hydrofluoric acid based chemical for etching, and diluted hydrofluoric acid, buffered hydrogen fluoride, or the like can be used.

In this embodiment mode, diluted hydrofluoric acid of 0.5% is used for etching. In this embodiment mode, etching is conducted after the mask used for doping is removed. In this case, the portion to be a light path of luminescence generated from a light emitting element in the gate insulating film 604 and the second base insulating film 602 is heavily doped with impurities; therefore, it is etched at higher speed compared to the case where the second base insulating film 602 is not doped with impurities. However, the first base insulating film 601 is not doped with impurities; therefore, it is etched at normal speed. The etching speed can be changed by approximately two or three times, depending on amount or kind of impurities. The first base insulating film 601 can substantially function as an etching stopper in etching and forming the opening portion 607.

Figure 8C:
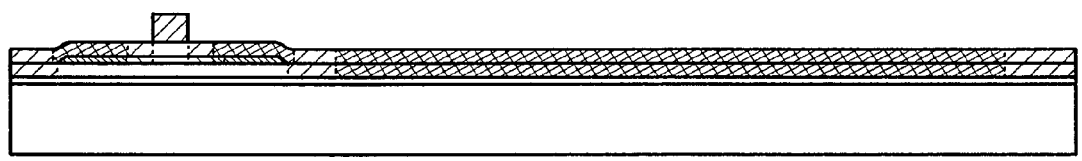
Figure 8D:
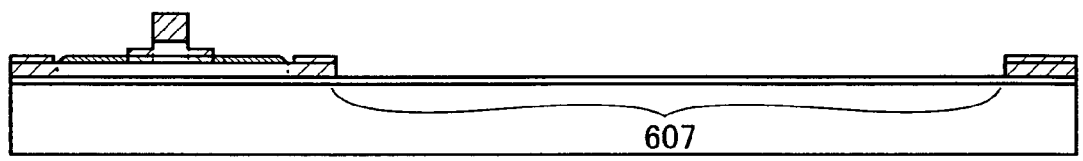

As described above, the base insulating film is provided in order to prevent an impurity element (ion) from diffusing from a substrate and causing an adverse effect. Therefore, the base insulating film preferably remains, even after the opening portion 607 is formed. The manufacturing method according to the invention enables the base insulating film to certainly and easily to remain. The gate insulating film 604 and the second base insulating film 602 in a portion to be the opening portion 607 can be etched to be selectively the opening portion 607, even without a mask for etching, since the etching speed thereof is higher (FIGS. 8C and 8D).

Figure 8E:
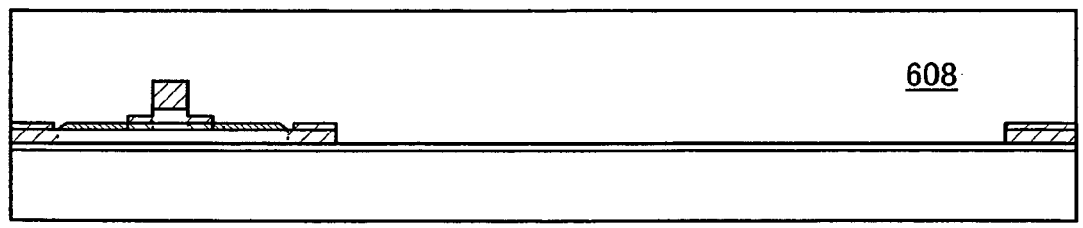
Figure 9A:
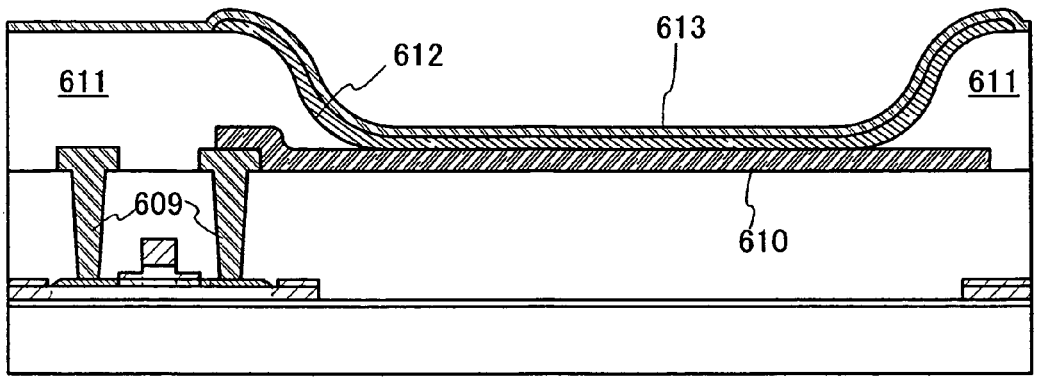
FIGS. 9A to 9D are diagrams showing steps for manufacturing a display device.

Subsequently, an interlayer insulating film 608 is formed (FIG. 8E). Then, a contact hole is disposed in the interlayer insulating film 608; thus, a wiring 609, a first electrode 610, a bank 611, a light emitting layer 612, and a second electrode 613 are formed (FIG. 9A). Each material thereof and the manufacturing method are the same as in Embodiment Mode 2.

Then, a display portion is sealed. In the case of using an opposing substrate for sealing, the opposing substrate is attached by using an insulating sealing member so that an external connection portion is exposed. A depression may be formed on the opposing substrate, and a drying agent may be attached thereto. A space between the opposing substrate and the substrate over which elements are formed may be filled with a dry inert gas such as nitrogen, or the opposing substrate may be formed by entirely applying a sealing member to the pixel portion. It is preferable to use an ultraviolet curing resin or the like as the sealing member. The sealing member may be mixed with a drying agent or particles for keeping a gap constant. Then, a display device is completed by attaching a flexible wiring board to an external connection portion.

Note that either an analog video signal or a digital video signal may be used for a light emitting display device of the invention having a display function. In the case of using the digital video signal, the video signal can be divided into a video signal using voltage and a video signal using current. A video signal, inputted to a pixel when luminescence is produced from a light emitting element, includes a constant voltage video signal and a constant current video signal. The constant voltage video signal includes a signal in which voltage applied to a light emitting element is constant and a signal in which current applied to a light emitting element is constant. The constant current video signal includes a signal in which voltage applied to a light emitting element is constant and a signal in which current applied to a light emitting element is constant. Drive with the signal in which voltage applied to a light emitting element is constant is constant voltage drive, and that with the signal in which current applied to a light emitting element is constant is constant current drive. By constant current drive, constant current is applied to a light emitting element, regardless of a change in resistance of the light emitting element. For a display device of the invention and a driving method thereof, either a driving method using voltage of a video signal or a driving method using current of a video signal may be used, and either constant voltage drive or constant current drive may be used.

Hereinabove, a method for manufacturing a display device in this embodiment mode of the invention is described. The display device formed by the manufacturing method described in this embodiment mode has the opening portion 607, thereby decreasing the number of films through which luminescence produced from a light emitting element passes to be extracted out of the display device. Therefore, a multiple interaction of luminescence due to reflection, refraction, or the like enables probability of causing a standing way to be greatly reduced.

In addition, the invention has several variations, the kind, shape, and material of the thin film transistor can be changed, without limiting to the above description. The laminated structure may have several structures. Some examples follow.

Figure 9B:
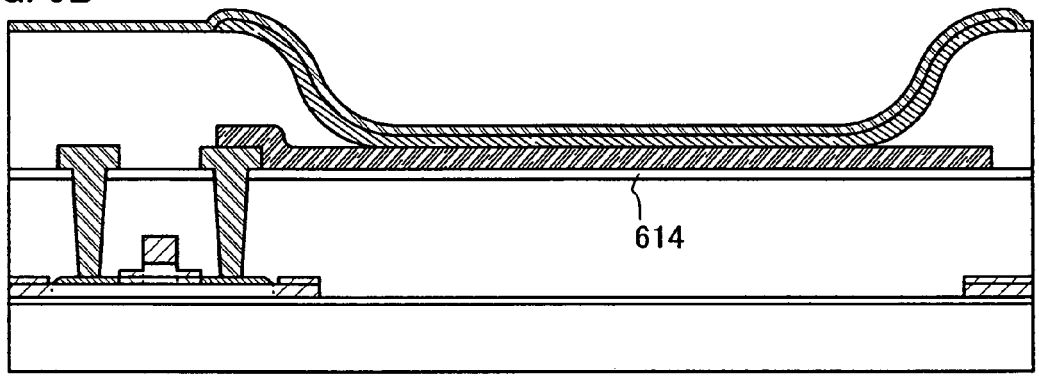

FIG. 9B shows a structure in which an etching stopper film 614 is provided between the interlayer insulating film 608 and the first electrode 610. The etching stopper film 614 is mainly formed of a silicon nitride based film to prevent the interlayer insulating film 608 from be etched in etching to form the first electrode 610. The etching stopper film 614 is formed after the interlayer insulating film 608 is formed, and a contact hole is formed in the etching stopper film 614 in conjunction with forming a contact hole in the interlayer insulating film 608. The other steps are the same as those in FIG. 9A.

Figure 9C:
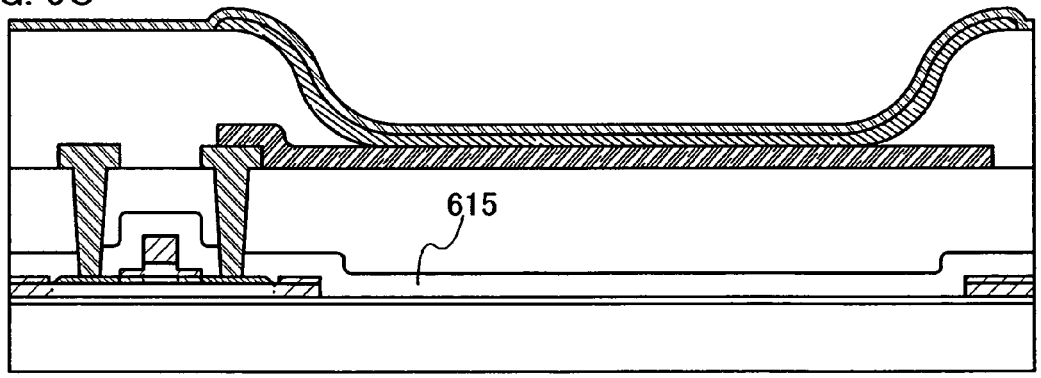

FIG. 9C shows a structure in which a silicon nitride based hydrogenation film 615 is provided between the gate insulating film 604 or the gate electrode 605 and the interlayer insulating film 608. The hydrogenation film 615 operates to prevent the semiconductor layer 603 from being doped with impurities (ion) and to hydrogenate the semiconductor layer 603 by hydrogen thermally excited to terminate a dangling bond. The hydrogenation film 615 is formed of a silicon nitride based film after the gate electrode 605 is formed, and may be formed by each CVD method such as a plasma CVD method. Subsequently, heat treatment is conducted in the case of hydrogenate the semiconductor layer 603; however, hydrogen treatment can be conducted in conjunction with baking siloxane in the case of forming the interlayer insulating film 608 by siloxane. The other steps is the same as those in FIG. 9A.

Figure 9D:
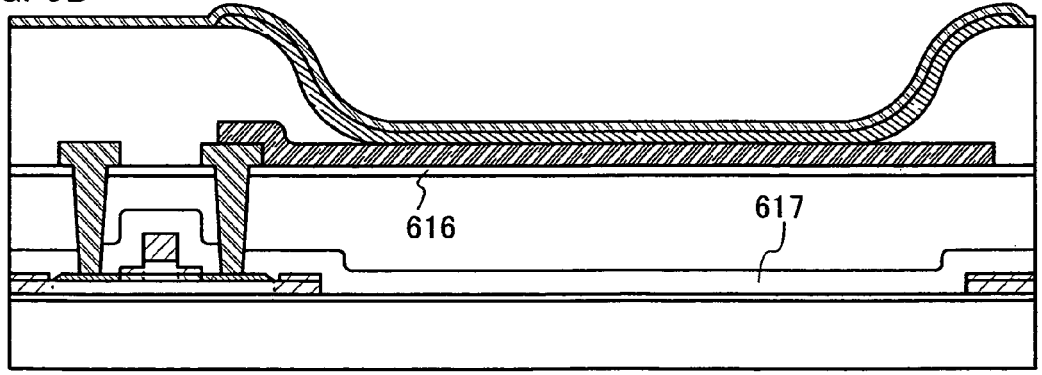

FIG. 9D shows a structure in which both an etching stopper film 616 and a hydrogenation film 617 are provided. The manufacturing method and the others are the same as those in FIGS. 9A to 9C.

Figure 10A:
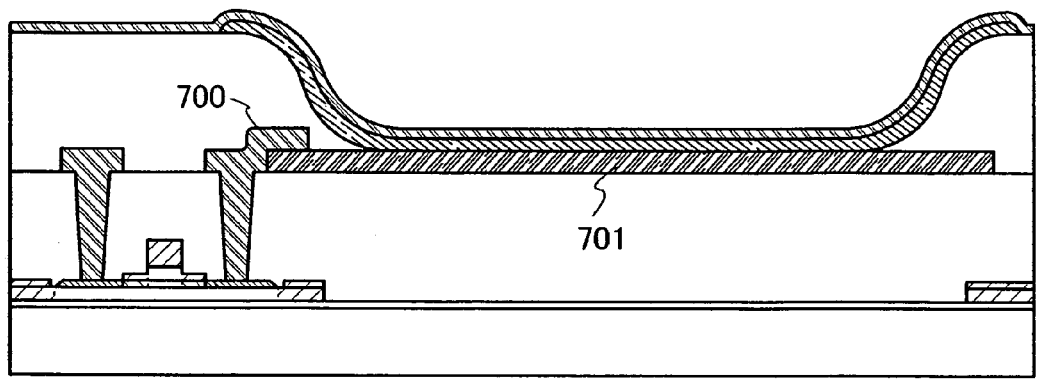
FIGS. 10A to 10D are diagrams showing steps for manufacturing a display device.

FIG. 10A shows the same structure as in FIG. 9A; however, s first electrode 700 of a light emitting element is formed before forming a wiring 701. In other words, the interlayer insulating film 608 is formed, then, a transparent conductive film is formed before forming the wiring 709, thereby forming the first electrode 700 by etching. A contact hole may be formed either before and after the first electrode 700 is formed. The other steps are the same as those in FIG. 9A; therefore, a display device can be formed with reference to the description of FIG. 9A.

Figure 10B:
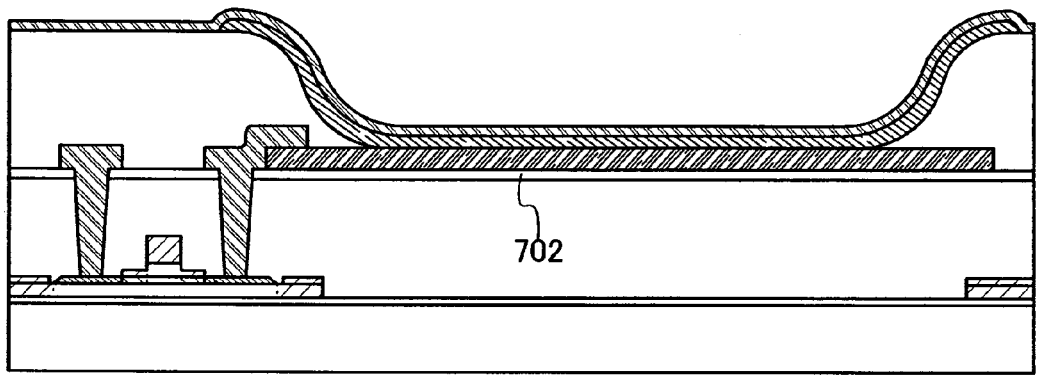

FIG. 10B shows a structure in which an etching stopper film 702 is provided in the structure in FIG. 10A. For the manufacturing method and the others of the etching stopper film 702, reference is made to the description of FIG. 2B. The other steps are the same as those in FIG. 10A.

Figure 10C:
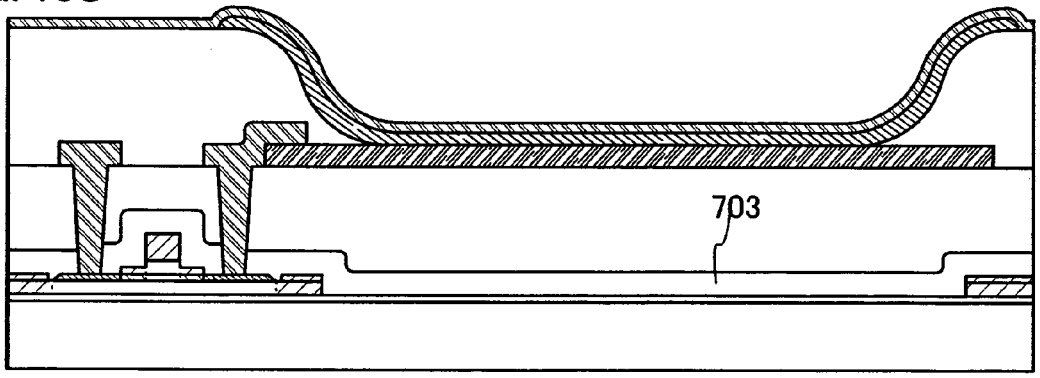

FIG. 10C shows a structure in which a hydrogenation film 703 is provided in the structure in FIG. 10A. For the manufacturing method and the others of the hydrogenation film 703, reference is made to the description of FIG. 2C. The other steps are the same as those in FIG. 10A.

Figure 10D:
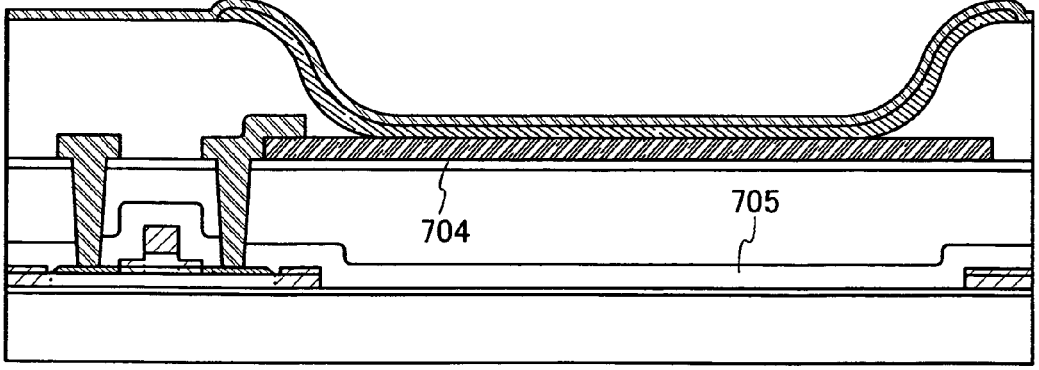

FIG. 10D shows a structure in which both an etching stopper film 704 and a hydrogenation film 705 are provided in the structure in FIG. 10A. For the manufacturing method and the others, reference is made to the descriptions of FIGS. 10A to 10C.

Embodiment Mode 4

In this embodiment mode, another embodiment mode according to the invention is described with reference to FIGS. 11A to 11E and 12A to 12C.

A first base insulating film 901, a second base insulating film 902, semiconductor layers 903 and 904, and a gate insulating film 905 are formed over a substrate 900. Steps up to this point are the same as those in FIGS. 1A and 1B; therefore, the description is omitted. Reference is made to the descriptions of FIGS. 1A and 1B.

Subsequently, gate electrodes 906 and 907 are formed; then, each gate electrode is formed of two layers: a first conductive layer 908 and a second conductive layer 909. The first conductive layer 908 is thinner than the second conductive layer 909, and an edge thereof is formed on each edge side of the semiconductor layers 903 and 904; that is, the cross-sectional shape thereof is like a hat. When the gate electrode has the above described shape and doping is conducted under proper condition, a gate overlapped light doped drain region can be formed in self-alignment.

A method for forming the hat like shaped gate insulating film is briefly described. A material to be used for a first conductive layer is formed over a gate insulating film, and a material to be used for a second conductive layer is stacked thereon. As the material, the above described material which can be used as a gate electrode may be used. Typically, TaN, Mo, or the like may be used for the first conductive layer 908 and W, Al, or the like may be used for the second conductive layer 909.

A mask is formed of a resist by a light-exposure step with photolithography to form an electrode and a wiring by etching the conductive film. A first etching condition and a second etching condition are used for a first etching. A gate electrode and a wiring are formed by etching using a mask of a resist. The etching conditions may be suitably selected.

In this embodiment, an example of etching in which TaN is used for the first conductive layer and W is used for the second conductive layer. In this case, an inductively coupled plasma (ICP) etching method may be used. As the first etching condition, $CF_4$, $Cl_2$, and $O_2$ are used as etching gases of which gas flow rate is respectively 25/25/10 (sccm), and plasma is generated with a pressure of 1.0 Pa by applying an RF power (13.56 MHz) of 500 W to a coil type electrode. A substrate side (sample stage) is also applied with an RF (13.56 MHz) power of 150 W, thus negative self bias voltage is substantially applied. By the first etching condition, the W film is etched to form an edge of the first conductive layer to have a tapered shape.

Subsequently, etching is performed under the second etching condition. With the mask of a resist remaining, etching is performed for approximately 15 seconds by using $CF_4$ and $Cl_2$ as etching gases of which gas flow rate is each 30/30 (sccm), and by applying an RF (13.56 MHz) power of 500 W to a coil type electrode with a pressure of 1.0 Pa to generate plasma. A substrate side (sample stage) is also applied with an RF (13.56 MHz) power of 20 W, thus negative self bias voltage is substantially applied. Under the second etching condition using $CF_4$ and $Cl_2$, both of the W film and the TaN film are etched to the same extent to each other.

In the first etching process, edges of the first conductive layer and the second conductive layer are formed into a tapered shape by an effect of a bias voltage applied to the substrate side.

Subsequently, a second etching process is performed without removing the mask of a resist. In the second etching process, etching is performed for approximately 25 seconds by using $SF_6$, $Cl_2$, and $O_2$ as etching gases of which gas flow rate is respectively 24/12/24 (sccm), and by applying an RF (13.56 MHz) power of 700 W to a coil type electrode with a pressure of 1.3 Pa to generating plasma. A substrate side (sample stage) is also applied with an RF (13.56 MHz) power of 10 W, thus a substantial amount of negative self bias voltage is applied. In this etching condition, the W film is selectively etched to form a second conductive film. At this time, the first conductive layer is slightly etched. By the first and second etching processes, the gate electrodes 906 and 907 are formed of the first conductive layer 908 and the second conductive layer 909 to have the shape shown in FIG. 11A.

Then, the semiconductor layers 903 and 904 are doped with impurities. First, without removing the mask of a resist, a first doping process is performed. The first doping process is performed by lightly doping with impurities which impart an N type to a semiconductor layer. The first doping process may be performed by an ion doping method or an ion implantation method. The ion doping may be performed with a dosage of $1 \times 10^{13}$ to $5 \times 10^{14}$ atoms/cm$^2$ and an acceleration voltage of 40 to 80 kV. In this embodiment, an acceleration voltage is 50 kV. As an impurity element thereof which imparts an N type, an element belonging to a group 15 of the periodic table, typically phosphorus (P) or arsenic (As), can be used. In this embodiment mode, phosphorus (P) is used and a lightly-doped first impurity region (N$^{--}$ region) is formed using the first conductive layer as a mask in self-alignment. The gate insulating film 905 and the second base insulating film 902 are lightly doped with impurities in conjunction with this doping. Note that, at this time, an acceleration voltage is set not to dope the first base insulating film 901 with impurities.

Then, a mask 910 is formed of a resist and a second doping process is performed at a higher acceleration voltage than in the first doping process. In the second doping process, doping with impurities which impart an N type is also performed. The ion doping may be performed with a dosage of $1 \times 10^{13}$ to $3 \times 10^{15}$ atoms/cm$^2$ and an acceleration voltage of 60 to 120 kV. In this embodiment, the dosage is $3.0 \times 10^{15}$ atoms/cm$^2$ and the acceleration voltage is 65 kV. In the second doping process is performed using the mask 910 of a resist and the second conductive layer as a mask to the impurity element. Note that, there are the gate electrode and the semiconductor layer which are not covered; however, this is not shown in FIGS. 11A to 11E. Such a semiconductor layer under the first conductive layer is also doped with the impurity element.

Note that an opening portion is formed in a portion to be a light path in emitting luminescence generated from a light emitting element in the mask 910. The opening portion of the gate insulating film 905 and the second base insulating film 902 are simultaneously doped with impurities. In addition, at this time, an acceleration voltage is also set so as not to dope the first base insulating film 901 with impurities.

By performing the second doping, a second impurity region (N⁻ region) is formed in a portion which is overlapped with the first conductive layer 908 in the semiconductor layer but which is not overlapped with the second conductive layer 909 or which is not covered with the mask; however this is not shown in the diagrams. The second impurity region is doped with impurities which impart an N type in the concentration range from $1\times10^{18}$ to $5\times10^{19}$ atoms/cm³. In addition, a exposed portion (a third impurity region: N⁺ region) of the semiconductor layer which is not covered with the first conductive layer 908 and the mask and is doped with the impurities which impart an N type at a high concentration in the range from $1\times10^{19}$ to $5\times10^{21}$ atom/cm³. The semiconductor layer has a portion which is partially covered only with the mask when the second doping is conducted. The concentration of impurities which impart an N type in this portion is the same as that in the first doping process. Therefore, the portion is referred to as the first impurity region (N⁻⁻ region).

Each impurity region is formed by two doping processes in this embodiment mode; however, the invention is not limited to this. Doping may be performed once or multiple times to form an impurity region having a desired impurity concentration by suitably setting conditions.

Next, the mask of a resist is removed, then, a new mask 912 is formed of a resist to perform a third doping process. By the third doping process, the semiconductor layer 904 to be a P-channel TFT is doped with an impurity element which imparts an opposite conductivity type to the first and second conductivity types to form a fourth impurity region (P⁺ region) and a fifth impurity region (P⁻ region).

In the third doping process, the fourth impurity region (P⁺ region) is formed on a portion which is not covered with the mask 912 with a resist and is not overlapped with the first conductive layer, and the fifth impurity region (P⁻ region) is formed on a portion which is not covered with the mask 912 with a resist, and is overlapped with the first conductive layer, but is not overlapped with the second conductive layer. As the impurity element which imparts a P type, an element belonging to a group 13 of the periodic table, such as boron (B), aluminum (Al), and gallium (Ga) are known.

In this embodiment mode, the fourth and fifth impurity regions are formed by using boron (B) as the P type impurity element by an ion doping method using diborane ($B_2H_6$). The ion doping is performed with a dosage of $1\times10^{16}$ atoms/cm² and an acceleration voltage of 80 kV.

Note that the semiconductor layer 903 in which the N-channel TFT is formed is covered with the mask 912 with a resist in the third doping process. In addition, an opening portion is formed in a portion to be a light path in emitting luminescence generated from a light emitting element in the mask 912. The opening portion of the gate insulating film 905 and the second base insulating film 902 may be simultaneously doped with impurities again. In addition, in this time, an acceleration voltage is also set not to dope the first base insulating film 901 with impurities.

Here, the fourth impurity region (P⁺ region) and the fifth impurity region (P⁻ region) are doped with phosphorus at different concentrations in the first and second doping processes. However, the third doping process is performed so that the fourth impurity region (P⁺ region) and the fifth impurity region (P⁻ region) are both doped with the impurity element which imparts a P type at a concentration of $1\times10^{19}$ to $5\times10^{21}$ atoms/cm². Therefore, the fourth impurity region (P⁺ region) and the fifth impurity region (P⁻ region) function as a source region and a drain region of a P-channel TFT without problems.

In this embodiment, the fourth impurity region (P⁺ region) and the fifth impurity region (P⁻ region) are formed by performing the third doping process once; however, the invention is not limited to this. Doping may be performed multiple times to form the fourth impurity region (P⁺ region) and the fifth impurity region (P⁻ region) by suitably setting conditions of the doping process.

Figure 11A:
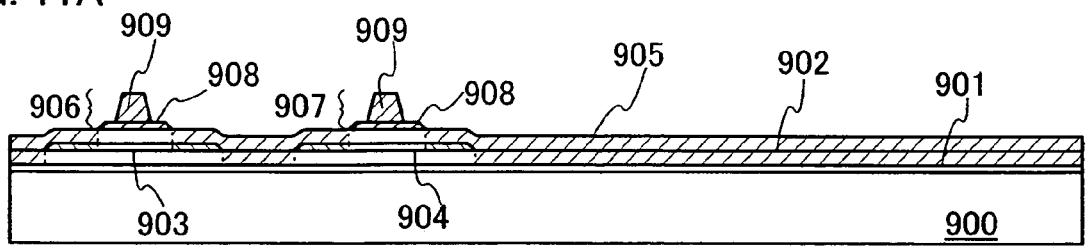
FIGS. 11A to 11E are diagrams showing steps for manufacturing a display device.
Figure 11B:
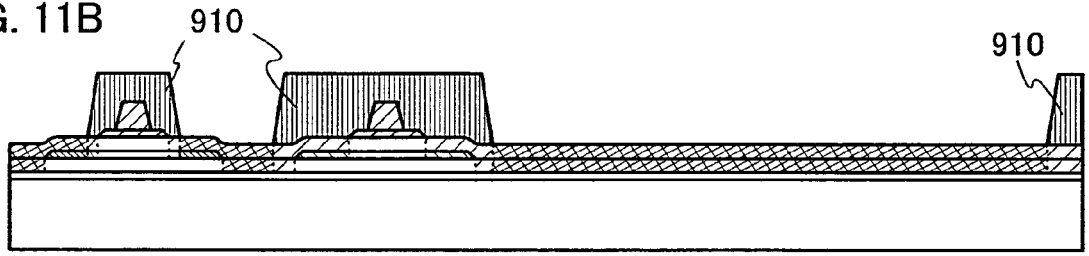
Figure 11C:
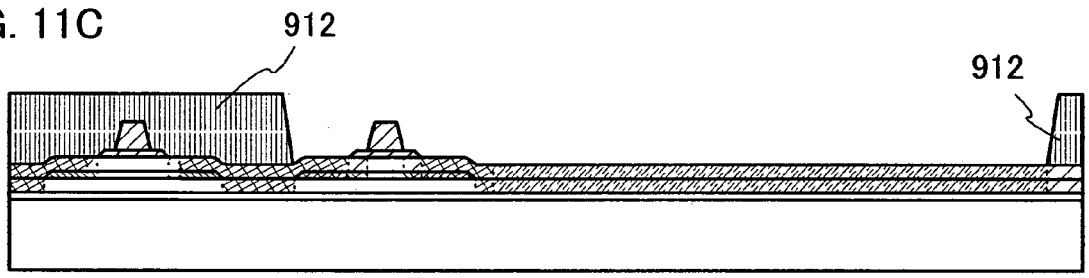
Figure 11D:
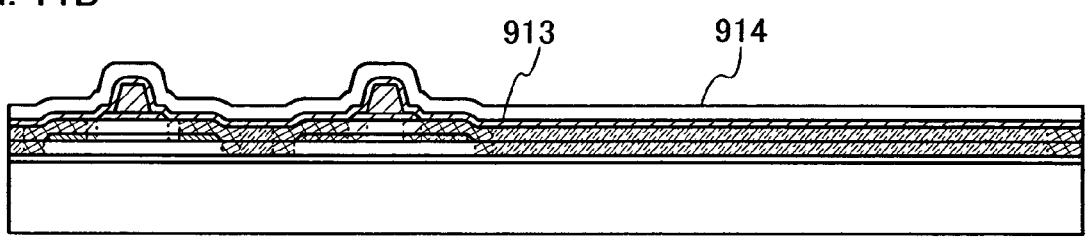

Next, the mask 912 is peeled, and the gate electrodes 906 and 907 and the gate insulating film 905 are covered to form a hydrogenation film 913 by a silicon nitride based material. The hydrogenation film 913 is formed, then, dangling bonds in the semiconductor layers 903 and 904 can be terminated by conducting heat treatment, thereby enhancing properties of a thin film transistor (FIG. 11D).

Subsequently, a first interlayer insulating film 914 is formed. The first interlayer insulating film is formed of an organic or inorganic insulating material. In this embodiment mode, a silicon oxide film containing nitride is used to form the first interlayer insulating film 914.

Figure 11E:
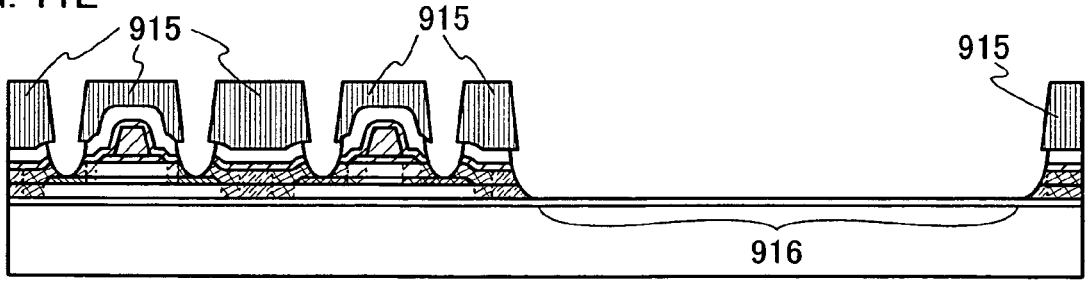

Subsequently, using a mask 915 with a photoresist or the like, a contact hole reaching the semiconductor layers 903 and 904 is formed in the first interlayer insulating film 914 and the gate insulating film 905; simultaneously, portions to be a light path of luminescence generated from a light emitting element in the first interlayer insulating film 914, the gate insulating film 905, and the second base insulating film 902 are removed to form an opening portion 916. Wet-etching is used with a hydrofluoric acid based chemical for etching, and diluted hydrofluoric acid, buffered hydrogen fluoride, or the like can be used. In this embodiment mode, diluted hydrofluoric acid of 0.5% is used for etching (FIG. 11E).

Luminescence generated from a light emitting element passes through several layers in a display device to be extracted out of the display device. Here, if each layer has different refractive index, a multiple interaction of luminescence may occur due to reflection or refraction in each interface. This causes a standing wave, thereby changing a color tone in viewing a light emitting surface of a display device from various angles, in other words, viewing angle dependency is generated. Thus, deterioration in quality of display of a display device is caused.

Thus, the opening portion 916 is formed in a portion to be a light path of luminescence of a light emitting element in order to decrease the number of films through which luminescence generated from a light emitting element passes to be extracted out of the display device. Therefore, a multiple interaction of luminescence due to reflection, refraction, or the like enables probability of causing a standing wave to be greatly reduced.

The portion to be a light path of luminescence produced from a light emitting element in the gate insulating film 905 and the second base insulating film 902 has been heavily doped with impurities; therefore, it is etched at higher speed compared to the case where the second base insulating film 102 is not doped with impurities. However, the first base insulating film 901 has not been doped with impurities; therefore, it is etched at normal speed. The etching speed can be changed by approximately twice or three times, depending on the amount or kind of impurities. The first base insulating film 901 can effectively function as an etching stopper when etching to form the opening portion 916. As described above, the base insulating film is provided in order to prevent an impurity element (ion) from diffusing from a substrate causing adversely effect. Therefore, the base insulating film preferably remains, even after the opening portion 916 is formed. The manufacturing method according to the invention enables the base insulating film to remain certainly and with ease.

Subsequently, a wiring 917 is formed to be in contact with the semiconductor layers 903 and 904 through a contact hole. A conductive layer for covering the contact hole and the first interlayer insulating film 914 is formed and processed to have a desired shape, thereby forming the wiring 917. It may be formed to be a single layer of aluminum, copper, molybdenum, or the like; however, in this embodiment mode, it is formed to have a structure of molybdenum, aluminum, and molybdenum stacked in this order. As the laminated wiring, a structure of titanium, aluminum, and titanium stacked in this order, or a structure of titanium, titanium nitride, aluminum, and titanium stacked in this order, or both structures using aluminum mixed with silicon in the above laminations may be used. The processing of the conductive layer may be conducted by dry-etching or wet-etching using a resist (FIG. 12A).

Figure 12A:
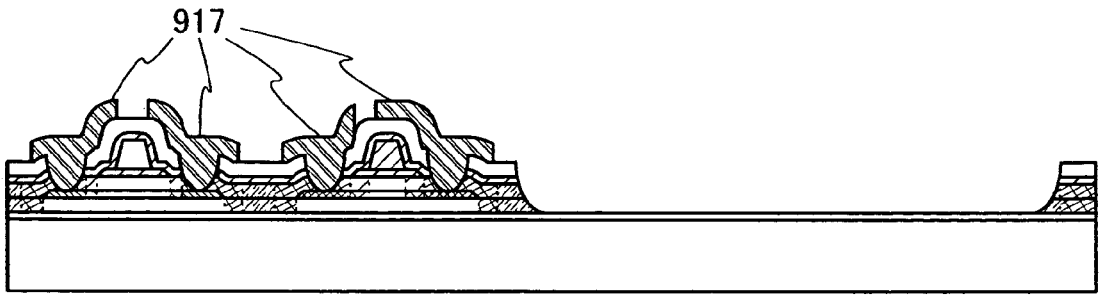
FIGS. 12A to 12C illustrate display devices manufactured by a method for manufacturing a display device according to the invention.
Figure 12B:
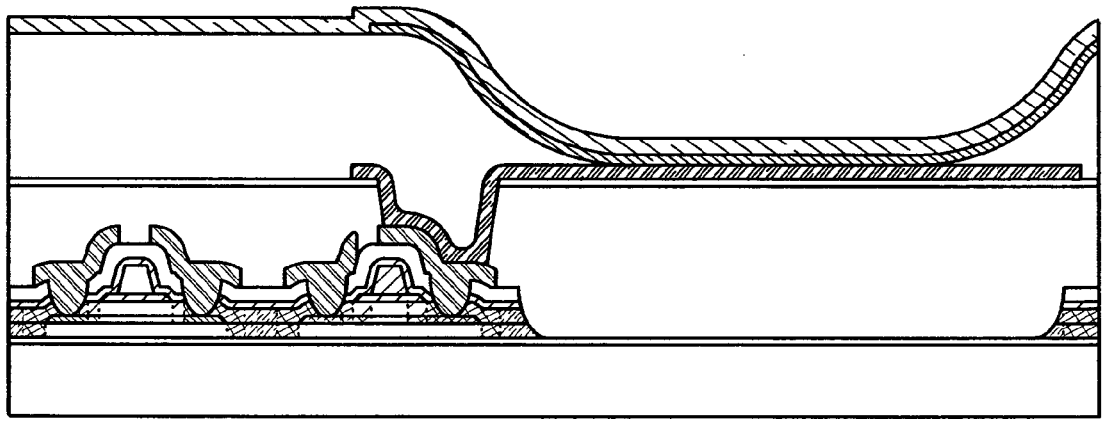

The other manufacturing steps and a method for putting a state in FIG. 12A into a state in FIG. 12B are the same as those in FIGS. 2A to 2C; therefore, reference is made to the descriptions of FIGS. 2A to 2C.

Figure 12C:
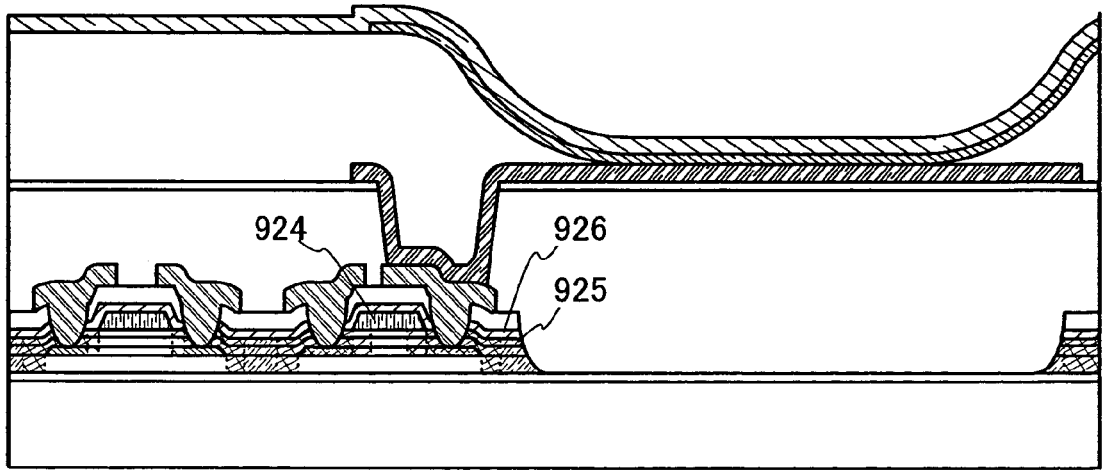

FIG. 12C shows almost the same structure as in FIG. 2D; however, it is different in the point where a gate electrode 924 is formed to have a tapered edge and a single layer. Such shaped gate electrode 924 may be used. The gate electrode 924 in FIG. 12C is formed to be entirely surrounded with a second gate insulating film 925 and a hydrogenation film 926 which are formed of a silicon nitride base film; therefore, it can operate with stability, even when using Mo as the material of the gate electrode 924.

Embodiment Mode 5

Figure 13A:
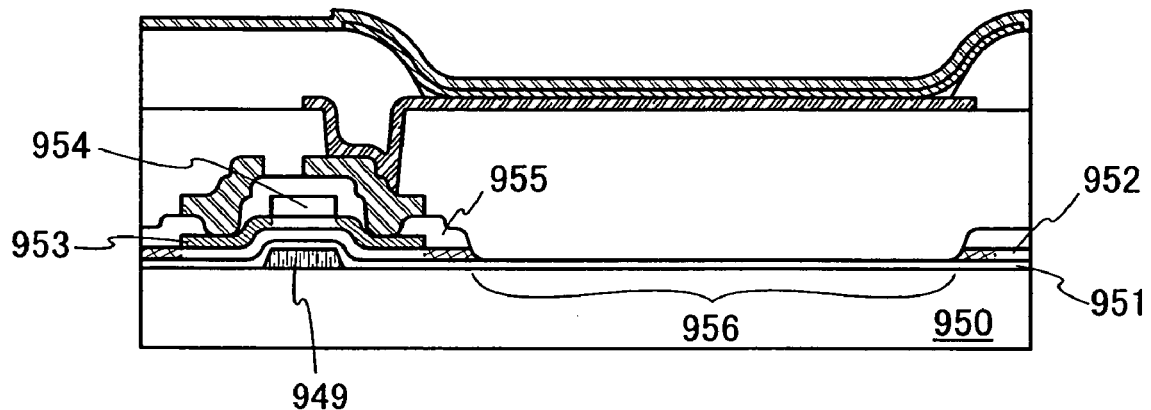
FIGS. 13A and 13B illustrate display devices manufactured by a method for manufacturing a display device according to the invention.

In this embodiment mode, in the case of using a bottom gate thin film transistor, a display device which is formed by a manufacturing method according to the invention is described with reference to FIG. 13A. Note that the steps which are not particularly described in this embodiment mode are the same as the above described manufacturing method.

In the case of using a bottom gate thin film transistor, a gate electrode 949 is formed over a substrate 950 and a first gate insulating film 951 and a second gate insulating film 952 are formed to cover the gate electrode 949. The first gate insulating film 951 is preferably formed of a silicon nitride based film in order to prevent impurities from entering from the substrate 950. The second gate insulating film 952 is preferably formed of a silicon oxide based film having excellent insulation and a low trap level. However, a gate insulating film may be formed of one silicon nitride based film. The case of forming the gate insulating film by a silicon nitride based film is describe with reference to FIG. 13B.

Subsequently, a semiconductor layer 953 is formed. The semiconductor layer 953 may be formed by the same method where the above described top gate semiconductor layer is formed. Then, a channel protective film 954 is formed over the semiconductor layer to cover a portion to be a channel region in the semiconductor layer. The channel protective film 954 prevents impurities which impart one conductive type from being introduced into the channel region in the subsequent doping.

Next, the semiconductor layer 953 is doped with impurities. Simultaneously, the second gate insulating film 952 is doped with impurities. The doping with impurities is conducted with an acceleration voltage where the semiconductor layer 842 is doped with impurities; therefore, the second gate insulating film 952 can also be doped with impurities. An acceleration voltage is set so as not to dope the first gate insulating film 951 with impurities.

A first interlayer insulating film 955 is formed to cover the second gate insulating film 952 and the channel protective film 954. Next, a contact hole reaching the semiconductor layer 953 is formed in the first interlayer insulating film 955. Simultaneously, an opening portion 956 is formed in each portion to be a light path of luminescence generated from a light emitting element outside the display device in the first interlayer insulating film 955 and the second gate insulating film 952. Wet-etching is conducted using a mask to form the contact hole and the opening portion 956. A hydrofluoric acid based chemical (diluted hydrofluoric acid, buffered hydrogen fluoride, or the like) is used for etching.

At this time, the second gate insulating film 952 has been doped with impurities; therefore the etching speed thereof is higher compared to the case where the second base insulating film 102 is not doped with impurities. Thus, the first gate insulating film 951 can be used as an etching stopper in forming the opening portion 956.

For the sequential steps, reference is made to the description of FIG. 2A. Note that this structure can be used for every adaptive pattern described above.

Figure 13B:
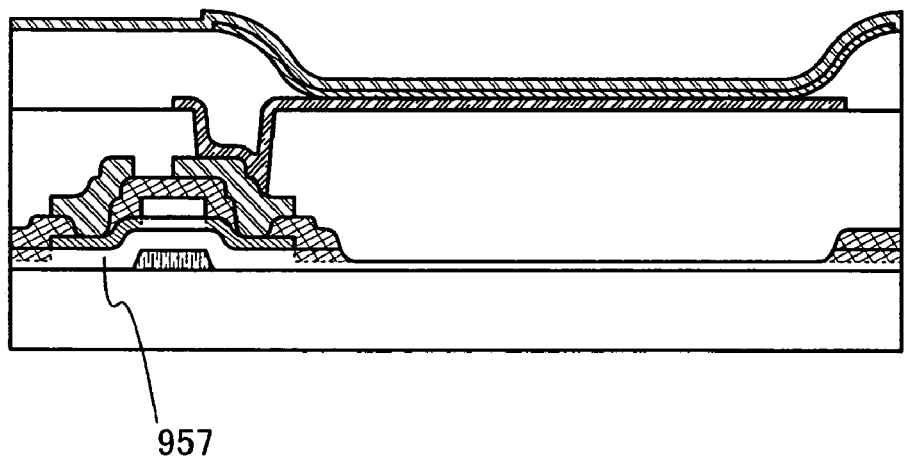

FIG. 13B is an example of forming the gate insulating film 957 by a silicon nitride based film. It is different from in FIG. 13A in that doping is conducted after the first interlayer insulating film 955 is formed; however, doping can also be conducted before forming the first interlayer insulating film 955 in FIG. 13B.

In the case of forming the gate insulating film 957 to be a single layer as in FIG. 13B, it is conceivable that the first gate insulating film 957 is doped with impurities to the middle of the film during doping. Therefore, the impurity doped portion is etched at higher speed; however, the impurity undoped portion is etched at normal speed. As the result, the impurity undoped portion of the gate insulating film 957 may be effectively used as an etching stopper. The other manufacturing steps or the like are the same as those in FIG. 13a.

Embodiment Mode 6

Figure 14:
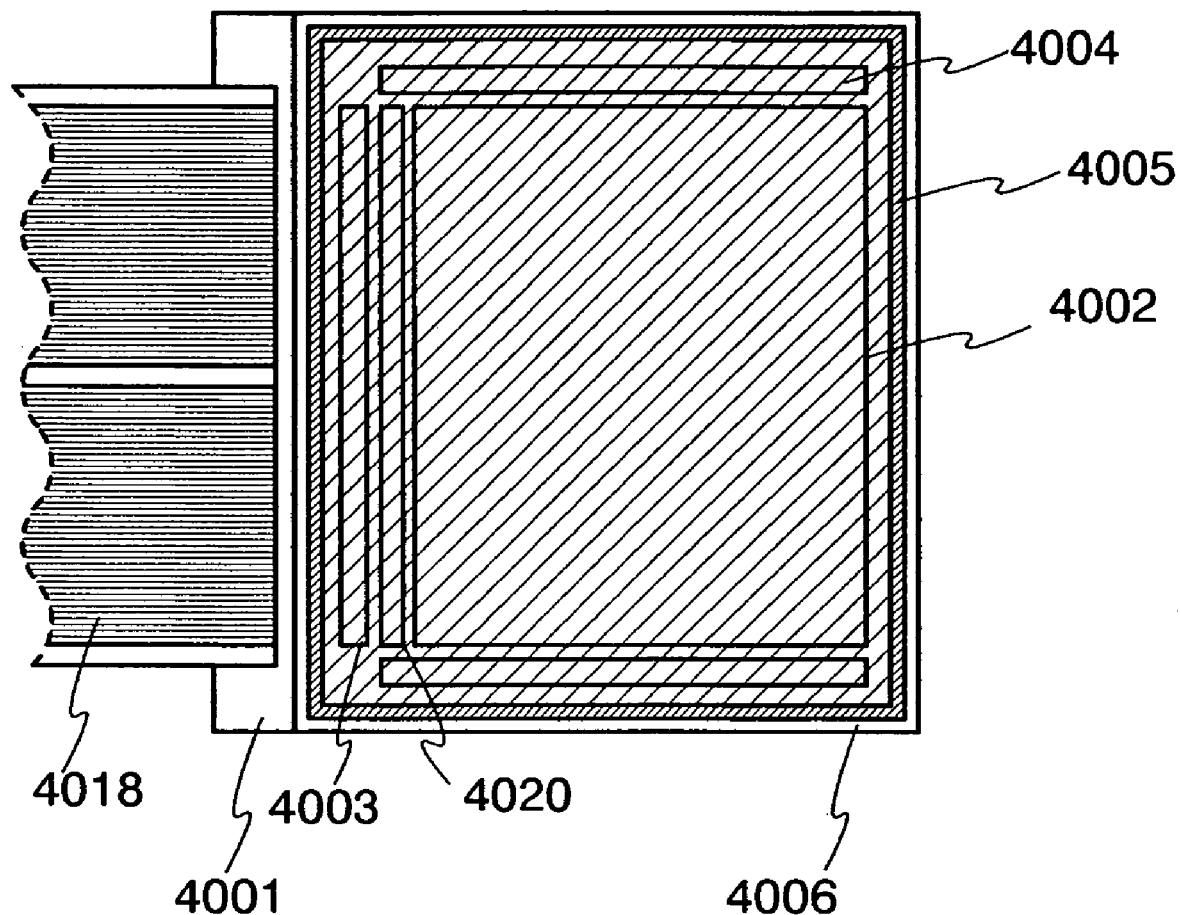
FIG. 14 is an example of a panel module manufactured by a method for manufacturing a display device according to the invention.

The appearance of a panel of a display device which corresponds to one mode of the invention is described in this embodiment mode with reference to FIG. 14. FIG. 14 is a top view of a panel in which a display device manufactured by a manufacturing method according to the invention is sealed with a sealing member formed between a substrate 4001 and an opposing substrate 4006.

A sealing member 4005 is provided to surround a pixel portion 4002, a signal processing circuit 4003, a signal line driver circuit 4020 and a scanning line driver circuit 4004 which are provided over a substrate. The opposing substrate 4006 is provided over the pixel portion 4002, the signal processing circuit 4003, the signal line driver circuit 4020, and the scanning line driver circuit 4004. Thus, the pixel portion 4002, the signal processing circuit 4003, the signal line driver circuit 4020, and the scanning line driver circuit 4004 are sealed with a substrate 4001, the sealing member 4005, and the opposing substrate 4006, together with filler.

The pixel portion 4002, the signal processing circuit 4003, the signal line driver circuit 4020, and the scanning line driver circuit 4004 which are provided over the substrate 4001 have a plurality of thin film transistors.

A lead wiring corresponds to a wiring for supplying signals or power voltage to the pixel portion 4002, the signal processing circuit 4003, the signal line driver circuit 4020, and the scanning line driver circuit 4004. The lead wiring is connected to a connection terminal, and the connection terminal is electrically connected to a terminal included in a flexible printed circuit (FPC) 4018 through an anisotropic conductive film.

An ultraviolet curing resin or a thermosetting resin as well as an inert gas such as nitrogen or argon can be used as the filler. That is, polyvinyl chloride, acrylic, polyimide, an epoxy resin, a silicone resin, polyvinyl butyral, or ethylene vinylene acetate can be used.

A display device of the invention includes a panel provided with a pixel portion having a light emitting element and a module in which an IC is mounted on the panel.

Such a panel or module has reduced viewing angle dependency and can provide a good display. Reliability is high in a mounted thin film transistor. The invention enables such a panel or module to be simply manufactured with high accuracy.

Embodiment Mode 7

Examples of an electronic device of the invention mounted with a module, as one example as described in Embodiment Mode 6, can be cited as follows: a camera such as a video camera or a digital camera, a goggle type display, a navigation system, an audio reproducing device (a car audio component or the like), a computer, a game machine, a portable information terminal (a mobile computer, a cellular phone, a portable game machine, an electronic book, or the like), an image reproducing device including a recording medium (specifically, a device capable of processing data in a recording medium such as a Digital Versatile Disc (DVD) and having a display that can display the image of the data), and the like. Practical examples of these electronic devices are shown in FIGS. 15A to 15E.

Figure 15A:
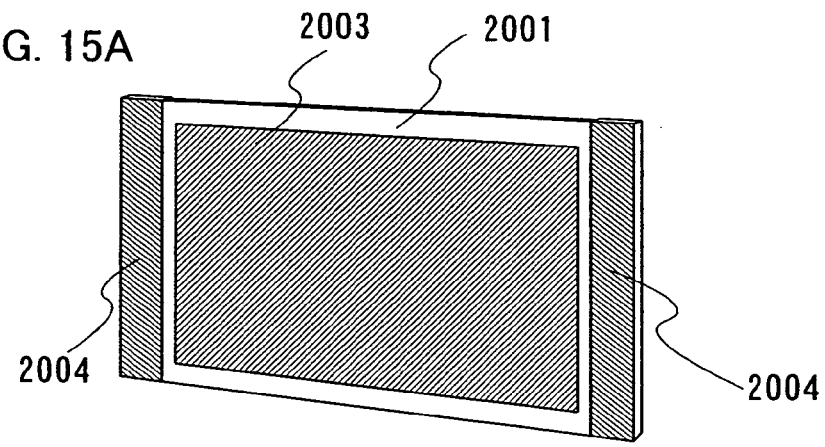
FIGS. 15A to 15E illustrate electronic devices manufactured by a method for manufacturing a display device according to the invention.

FIG. 15A shows a display device. A television set, a computer monitor, or the like is regarded as the display device. The display device includes a chassis 2001, a display portion 2003, a speaker portion 2004, and the like. In the display device manufactured by the manufacturing method according to the invention, the variation in an emission spectrum depending on an angle to a light emitting surface in the display portion 2003 can be reduced, and display quality is improved. A pixel portion is preferably provided with a polarizing plate or a circularly polarizing plate to enhance contrast. For example, a ¼λ plate, a ½λ plate, and a polarizing plate may be sequentially formed over a sealing substrate. Further, an anti-reflective film may be provided over the polarizing plate.

Figure 15B:
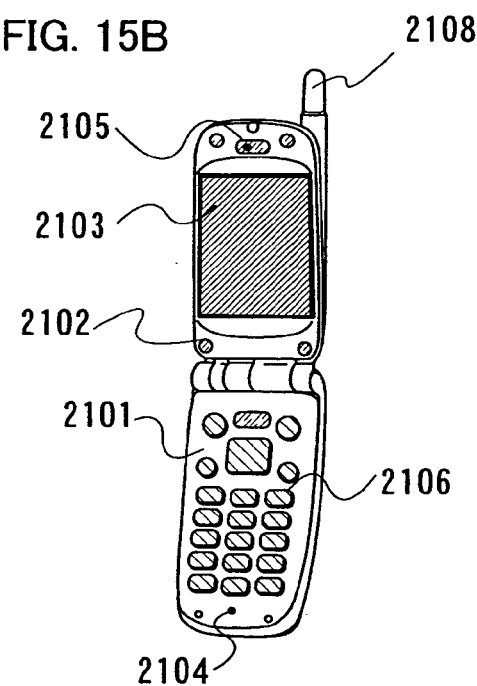

FIG. 15B shows a cellular phone, which includes a main body 2101, a chassis 2102, a display portion 2103, an audio input portion 2104, an audio output portion 2105, an operation key 2106, an antenna 2108, and the like. In the cellular phone manufactured by the manufacturing method according to the invention, the deterioration of a light emitting element in the display portion 2103 is suppressed, thereby improving reliability.

Figure 15C:
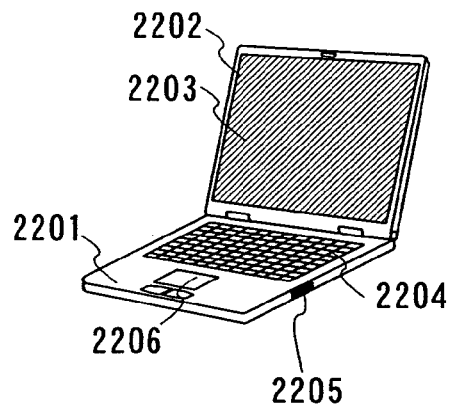

FIG. 15C shows a computer, which includes a main body 2201, a chassis 2202, a display portion 2203, a keyboard 2204, an external connection port 2205, a pointing mouse 2206, and the like. In the computer manufactured by the manufacturing method according to the invention, the variation in an emission spectrum depending on an angle to a light emitting surface in the display portion 2203 can be reduced, and display quality is improved. Although a laptop computer is shown in FIG. 15C as an example, the invention can be applied to a desktop computer in which a hard disk and a display portion are integrated, and the like.

Figure 15D:
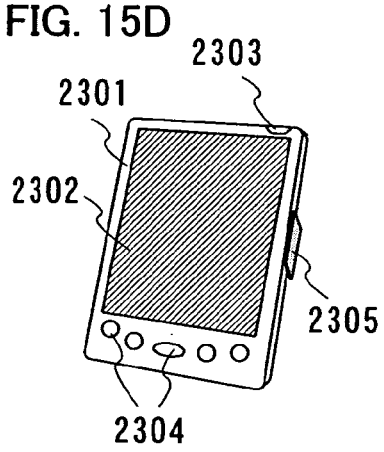

FIG. 15D shows a mobile computer, which includes a main body 2301, a display portion 2302, a switch 2303, operation keys 2304, an infrared port 2305, and the like. In the mobile computer manufactured by the manufacturing method according to the invention, the deterioration of a light emitting element in the display portion 2302 is suppressed, thereby improving reliability.

Figure 15E:
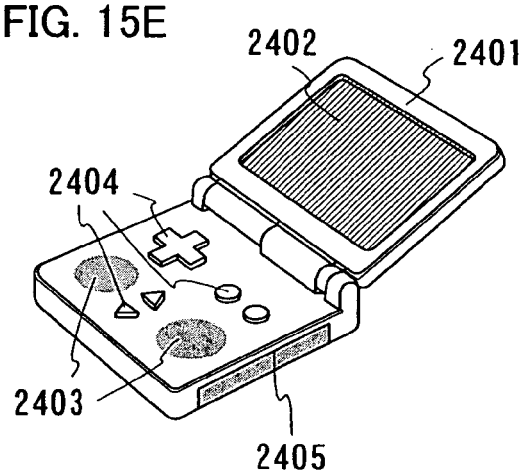

FIG. 15E shows a portable gaming machine, which includes a chassis 2401, a display portion 2402, a speaker portion 2403, operation keys 2404, a recording medium insertion portion 2405, and the like. In the portable gaming machine manufactured by the manufacturing method according to the invention, the deterioration of a light emitting element in the display portion 2402 is suppressed, thereby improving reliability.

As described above, the applicable range of the invention is so wide that the invention may be applied to electronic devices of various fields, and a good display can be provided. It may easily manufacture with accuracy a highly reliable product.

Embodiment Mode 8

Each structure of light emitting layers 114, 412, and 612 is described in detail in this embodiment mode.

The light emitting layer may be formed of a charge injection transport material and a light emitting material including an organic compound or inorganic compound. The light emitting layer includes one or plural kinds of layers of a low molecular weight organic compound, an intermediate molecular weight organic compound (referring to an organic compound which does not have sublimation property and has the number of molecules of 20 or less or a molecular chain length of 10 μm or less), and a high molecular weight organic compound. The light emitting layer may be combined with an electron injection transport or hole injection transport inorganic compound.

As a highly electron transporting material among charge injection transport materials, a metal complex that has a quinoline skeleton or a benzoquinoline skeleton such as tris(8-quinolinolato) aluminum [$Alq_3$], tris(5-methyl-8-quinolinolato) aluminum [$Almq_3$], bis(10-hydroxybenzo[h]-quinolinato) beryllium [$BeBq_2$], or bis(2-methyl-8-quinolinolato)-4-phenylphenolato-aluminum [BAlq], or the like can be used. As a highly hole transporting material, an aromatic amine compound (that is, a compound having a benzene ring-nitrogen bond) such as 4,4'-bis[N-(1-naphthyl)-N-phenyl-amino]-biphenyl [α-NPD], 4,4'-bis[N-(3-methylphenyl)-N-phenyl-amino]-biphenyl [TPD], 4,4',4"-tris(N,N-diphenyl-amino)-triphenylamine [TDATA], or 4,4',4"-tris[N-(3-methylphenyl)-N-phenyl-amino]-triphenylamine [MTDATA] can be used.

As a highly electron injecting material among charge injection transport materials, a compound of an alkali metal or an alkaline earth metal such as lithium fluoride (LiF), cesium fluoride (CsF), or calcium fluoride ($CaF_2$) can be used. In addition, the highly electron injecting material may be a mixture of a highly electron transporting material such as $Alq_3$ and an alkaline earth metal such as magnesium (Mg).

As a highly hole injecting material among charge injection transport materials, metal oxide such as molybdenum oxide (MoOx), vanadium oxide (VOx), ruthenium oxide (RuOx), tungsten oxide (WOx), or manganese oxide (MnOx) can be used. In addition, a phthalocyanine compound such as phthalocyanine [$H_2Pc$] or copper phthalocyanine (CuPC) can be used.

The light emitting layer may have a structure for performing color display by providing each pixel with light emitting layers having different emission wavelength bands. Typically, a light emitting layer corresponding to each color of R (red), G (green), and B (blue) is formed. In this case, color purity can be increased and a pixel portion can be prevented from having a mirror surface (glare) by providing a light emitting side of a pixel with a filter (colored layer) which transmits light of an emission wavelength band. Providing a filter (colored layer) can omit a circularly polarizing plate or the like which is conventionally used to prevent a pixel portion from having a mirror surface (glare) and can eliminate the loss of light that light is reduced to half due to the use of a polarizing plate. Further, a change in hue, which occurs when a pixel portion (display screen) is obliquely seen, can be reduced.

A light emitting material includes various materials. As a low molecular weight organic light emitting material, 4-dicyanomethylene-2-methyl-6-[-2-(1,1,7,7-tetramethyl-9-julolidyl)ethenyl)-4H-pyran (abbreviation: DCJT); 4-dicyanomethylene-2-t-butyl-6-[2-(1,1,7,7-tetramethyl-julolidine-9-yl)ethenyl]-4H-pyran (abbreviation: DPA); periflanthene; 2,5-dicyano-1,4-bis[2-(10-methoxy-1,1,7,7-tetramethyl-julolidine-9-yl)ethenyl]benzene, N,N'-dimethylquinacridone (abbreviation: DMQd); coumarin 6; coumarin 545T; tris(8-quinolinolato)aluminum (abbreviation: $Alq_3$); 9,9'-biantryl, 9,10-diphenylanthracene (abbreviation: DPA); 9,10-bis(2-naphthyl)anthracene (abbreviation: DNA); and the like. Also, another material may be used.

A high molecular weight organic light emitting material is physically stronger than a low molecular weight material and is superior in durability of the element. In addition, a high molecular weight material can be used for application; therefore, the element is relatively easily manufactured. A structure of a light emitting element using a high molecular weight organic light emitting material is basically the same as one of a light emitting element using a low molecular weight organic light emitting material: a cathode, an organic light emitting layer, and an anode stacked in this order. However, it is difficult to form such a laminated structure as in the case of using a low molecular weight organic light emitting material, when a light emitting layer using a high molecular weight organic light emitting material is formed. A two-layer structure is employed in many cases. Specifically, the light emitting element using a high molecular weight organic light emitting material has a structure of a cathode, a light emitting layer, a hole transport layer, and an anode stacked in this order.

The emission color is determined by the material of the light emitting layer. Therefore, a light emitting element that emits desired light can be formed by selecting an appropriate material of the light emitting layer. As a high molecular weight electroluminescent material which can be used to form the light emitting layer, a polyparaphenylene-vinylene-based material, a polyparaphenylene-based material, a polythiophen-based material, or a polyfluorene-based material can be used.

As a polyparaphenylene-vinylene-based material, a derivative of poly(paraphenylene vinylene) [PPV], for example, poly(2,5-dialkoxy-1,4-phenylene vinylene) [RO-PPV], poly(2-(2'-ethyl-hexoxy)-5-methoxy-1,4-phenylene vinylene) [MEH-PPV], poly(2-(dialkoxyphenyl)-1,4-phenylene vinylene) [ROPh-PPV], or the like can be used. As a polyparaphenylene-based material, a derivative of polyparaphenylene [PPP], for example, poly(2,5-dialkoxy-1,4-phenylene) [RO-PPP], poly(2,5-dihexoxy-1,4-phenylene), or the like can be used. As a polythiophene-based material, a derivative of polythiophene [PT], for example, poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], poly[3-(4-octylphenyl)-2,2bithiophene] [PTOPT], or the like can be used. As the polyfluorene-based material, a derivative of polyfluorene [PF], for example, poly (9,9-dialkylfluorene) [PDAF], poly(9,9-dioctylfluorene) [PDOF], or the like can be used.

Note that a hole injection property from an anode can be enhanced by interposing a high molecular weight organic light emitting material having a hole transporting property between an anode and a high molecular weight organic light emitting material. This hole transporting material is generally dissolved into water together with an acceptor material, and the solution is applied by a spin coating method or the like. Since the hole transporting material is insoluble in an organic solvent, a laminate with the above-described organic light emitting material can be formed. A mixture of PEDOT and camphor sulfonic acid (CSA) that serves as an acceptor material, a mixture of polyaniline [PANI] and polystyrene sulfonic acid [PSS] that serves as an acceptor material, and the like can be used as the hole transporting high molecular weight organic light emitting material.

In addition, the light emitting layer can be formed to emit monochrome or white light. In the case of using a white light emitting material, a filter (colored layer) which transmits light having a specific wavelength is provided for a light emitting side of a pixel, thereby performing color display.

In order to form a light emitting layer which emits white light, for example, $Alq_3$, $Alq_3$ partially doped with Nile red that is a red light emitting pigment, p-EtTAZ, and TPD (aromatic diamine) are sequentially stacked by an evaporation method to obtain white light. When the light emitting layer is formed by applying liquid using spin coating, the layer after application is preferably baked by vacuum heating. For example, an aqueous solution of poly (ethylene dioxythiophene)/poly(styrene sulfonic acid) (PEDOT/PSS) may be entirely applied and baked to form a layer that functions as a hole injection layer. Then, a polyvinyl carbazole (PVK) solution doped with a light emitting center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) may be entirely applied and baked to form a layer that functions as a light emitting layer.

The light emitting layer may be formed to be a single layer. For example, a 1,3,4-oxadiazole derivative (PBD) having an electron transporting property may be dispersed in polyvinyl carbazole (PVK) having a hole transporting property. Another method to obtain white light emission is to disperse PBD of 30 wt % as an electron transporting agent and to disperse four kinds of pigments (TPB, coumarin 6, DCM1, and Nile red) in appropriate amounts. In addition to the light emitting elements described here that provide white light emission, a light emitting element that provides red light emission, green light emission, or blue light emission can be manufactured by appropriately selecting materials of the light emitting layer.

An injecting property of holes from the anode can be improved by interposing a high molecular weight organic light-emitting material having a hole transporting property between the anode and a high molecular weight organic light-emitting material having a light-emitting property. Generally, the high molecular weight organic light-emitting material having a hole transporting property and an acceptor material dissolved in water is coated by spin coating. The high molecular weight organic light-emitting material having a hole transporting property is not dissolved in organic solvent, accordingly, the material can be stacked over the organic light-emitting material having a light-emitting property. As the high molecular weight organic light-emitting material having a hole transporting property, mixture of PEDOT and camphoric sulfonic acid (CSA) as an acceptor material, mixture of polyaniline [PANI] and polystyrene sulfonic acid [PSS] as an acceptor material, and the like can be nominated.

Further, a triplet excitation light emitting material including a metal complex or the like as well as a singlet excitation light emitting material may be used for the light emitting layer. For example, among pixels emitting red, green, and blue light, a pixel emitting red light whose luminance is reduced by half in a relatively short time is made of a triplet excitation light emitting material and the rest are made of a singlet excitation light emitting material. A triplet excitation light emitting material has a characteristic that the material has a good luminous efficiency and consumes less power to obtain the same luminance. When a triplet excitation light emitting material is used for a red pixel, only a small amount of current needs to be applied to a light emitting element. Thus, reliability may be improved. A pixel emitting red light and a pixel emitting green light may be formed of a triplet excitation light emitting material and a pixel emitting blue light may be formed of a singlet excitation light emitting material to achieve low power consumption. Low power consumption can be further achieved by forming a light emitting element which emits green light that has high visibility with a triplet excitation light emitting material.

A metal complex used as a dopant is an example of a triplet excitation light emitting material, and a metal complex having platinum that is a third transition series element as a metal center, a metal complex having iridium as a central metal, and the like are known. A triplet excitation light emitting material is not limited to the above compounds. A compound having the above described structure and an element belonging to any of Groups 8 to 10 of the periodic table as a central metal can also be used.

The above described materials for forming the light emitting layer are just examples. A light emitting element can be formed by appropriately stacking functional layers such as a hole injection transport layer, a hole transport layer, an electron injection transport layer, an electron transport layer, a light emitting layer, an electron blocking layer, and a hole blocking layer. Further, a mixed layer or a mixed junction may be formed by combining these layers. The layer structure of the light emitting layer can be varied. Instead of providing a specific electron injection region or light emitting region, modification such as providing an electrode for the purpose or providing a dispersed light emitting material is acceptable as long as it does not deviate from the scope of the invention.

A light emitting element formed with the above described material emits light by being biased in a forward direction. A pixel of a display device formed with a light emitting element can be driven by a simple matrix mode or an active matrix mode. In either mode, each pixel emits light by applying a forward bias thereto in specific timing; however, the pixel is in a non-light-emitting state for a certain period. Reliability of a light emitting element can be improved by applying a reverse bias at this non-light-emitting time. In a light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating driving of applying a forward bias and a reverse bias. Thus, the reliability of a display device can be improved.

Embodiment Mode 9

An example of a display device using the invention is described in this embodiment mode. In this embodiment mode, a thin film transistor 809 having an LDD structure is connected to a light emitting element 814 through an electrode 808 of the thin film transistor. A gate insulating film is formed, doping is conducted, and etching is conducted after forming a mask to form an opening portion in a portion to be a light path where luminescence generated from a light emitting element is let out of the display device, so that a structure of the display device in this embodiment mode is obtained.

Figure 16A:
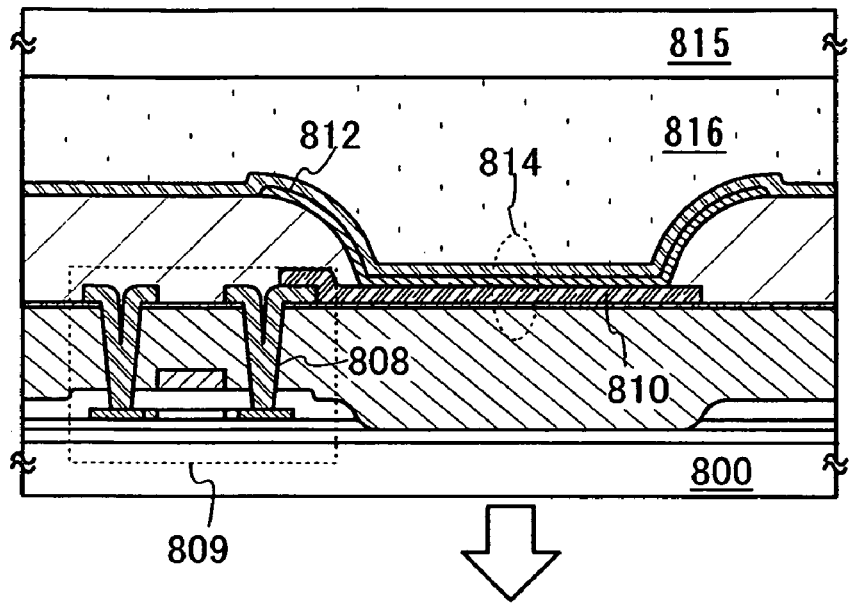
FIGS. 16A and 16B illustrate display devices manufactured according to the invention.

FIG. 16A shows a structure in which a first electrode 810 is formed of a light transmitting conductive film and luminescence generated from a light emitting layer 812 is extracted to the side of a substrate 800. Note that reference numeral 815 denotes an opposing substrate and is fixed to the substrate 800 with the use of a sealing member or the like after the light emitting element 814 is formed. A space between the opposing substrate 815 and the element is filled with a light transmitting resin 816 or the like, and sealing is performed. Accordingly, the deterioration of the light emitting element 814 due to moisture can be further suppressed. The resin 816 is preferably hygroscopic. When a highly light transmitting drying agent is dispersed in the resin 816, an influence of the moisture can be further reduced. Therefore, it is a more preferable mode.

Figure 16B:
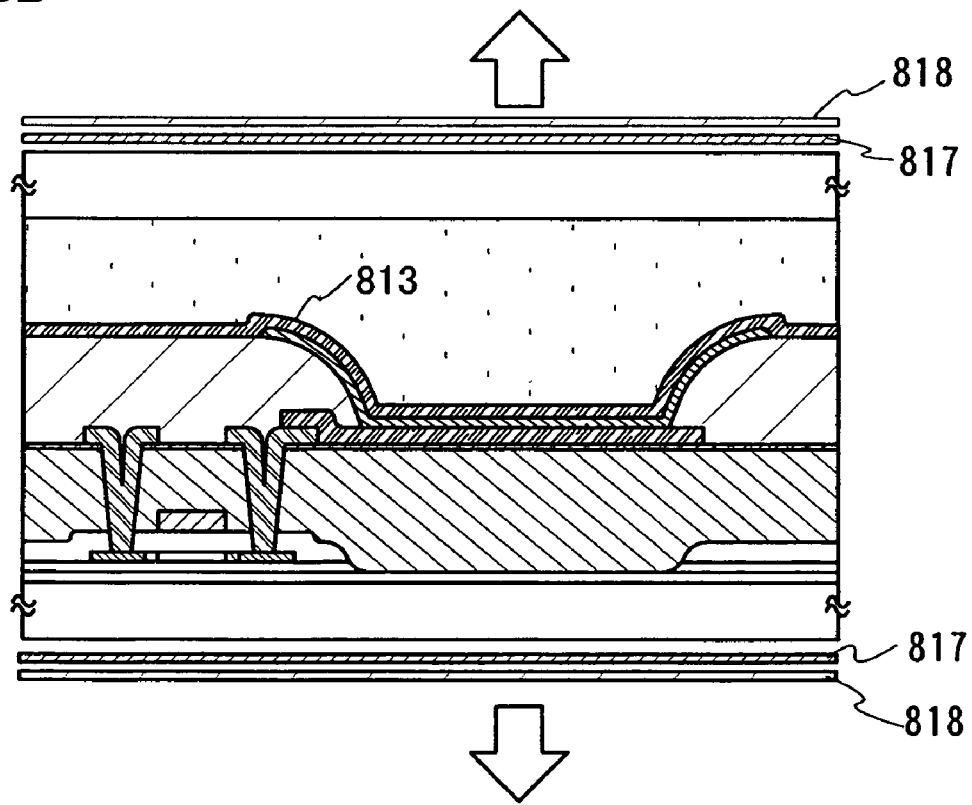

FIG. 16B shows a structure in which both a first electrode 810 and a second electrode 813 are each formed of a light transmitting conductive film and light can be emitted to both sides of the substrate 800 and the opposing substrate 815. In this structure, a screen can be prevented from being transparent by providing a polarizing plate 817 outside the substrate 800 and the opposing substrate 815, and visibility is increased. A protective film 818 is preferably provided outside the polarizing plate 817. If viewing angle dependency is generated by a multiple interaction of luminescence, the color may differ between light emitted upward and light emitted downward. The manufacturing method according to the invention may enable a display device in which such problems are eased to be simply manufactured with high accuracy.

The invention may enable a good display to be provided and a high reliable product to be simply manufactured with high accuracy.

Embodiment Mode 10

A pixel circuit, a protective circuit, and operations thereof are described in this embodiment mode.

Figure 17A:
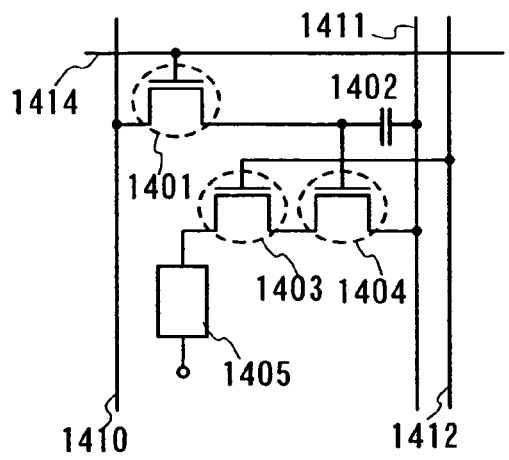
FIGS. 17A to 17F illustrate pixel circuits.

In a pixel shown in FIG. 17A, a signal line 1410 and power supply lines 1411 and 1412 are arranged in a column direction and a scanning line 1414 is arranged in a row direction. In addition, the pixel includes a switching TFT 1401, a driving TFT 1403, a current control TFT 1404, a capacitor element 1402, and a light emitting element 1405.

Figure 17B:
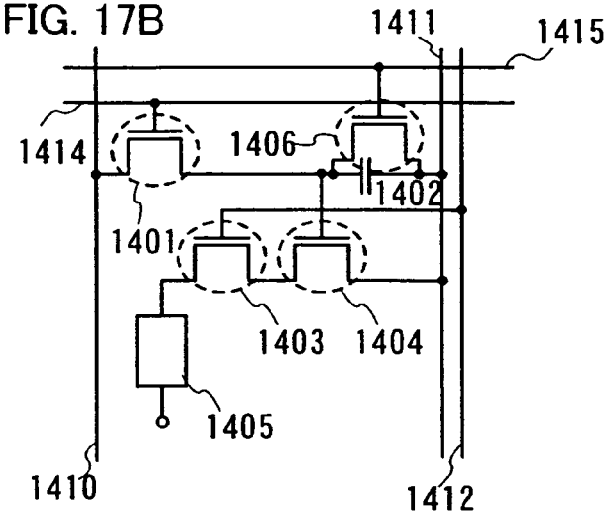
Figure 17C:
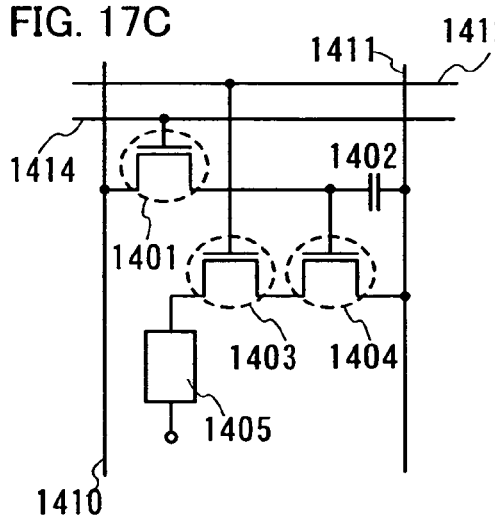
Figure 17D:
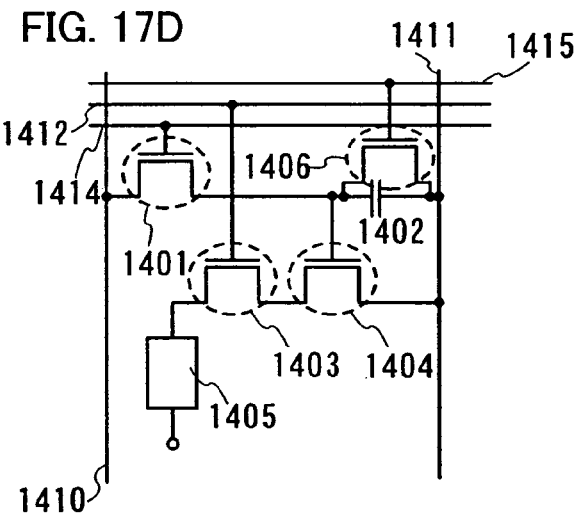

A pixel shown in FIG. 17C is different in a point where a gate electrode of a TFT 1403 is connected to a power supply line 1412 arranged in a row direction, but in other points, the pixel has a similar structure to that of the pixel shown in FIG. 17A. In other words, equivalent circuit diagrams of both of the pixels shown in FIGS. 17A and 17C are the same. However, each power supply line is formed using a conductive layer in a different layer when the power supply line 1412 is arranged in a column direction (FIG. 17A) and when the power supply line 1412 is arranged in a row direction (FIG. 17C). Here, a wiring connected to the gate electrode of the driving TFT 1403 is focused and the figures are separately shown in FIGS. 17A and 17C to show that the wirings are formed in different layers.

In the pixels shown in FIGS. 17A and 17C, the TFTs 1403 and 1404 are connected in series. A channel length L(1403) and a channel width W(1403) of the TFT 1403 and a channel length L(1404) and a channel width W(1404) of the TFT 1404 are preferably set to satisfy L(1403)/W(1403):L(1404)/W(1404)=5 to 6000:1.

Note that the TFT 1403 operates in a saturation region and has a role of controlling a value of electric current flowing through the light emitting element 1405, and the TFT 1404 operates in a linear region and has a role of controlling supply of electric current to the light emitting element 1405. It is preferable, from the viewpoint of the manufacturing steps, that the TFTs have the same conductivity type. In this embodiment mode, the TFTs are formed to be n-channel TFTs. Further, the TFT 1403 may be a depletion mode TFT as well as an enhancement mode TFT. In the invention having the above structure, the TFT 1404 operates in a linear region, so that slight variation in gate-source voltage (Vgs) of the TFT 1404 does not affect a value of electric current of the light emitting element 1405. In other words, the value of electric current of the light emitting element 1405 can be determined by the TFT 1403 which operates in a saturation region. According to the above described structure, luminance variation of the light emitting element, which is caused by the variation in characteristics of the TFT, can be improved, and a display device with improved image quality can be provided.

In pixels shown in FIGS. 17A to 17D, the TFT 1401 controls the input of a video signal to the pixel. When the TFT 1401 is turned on, the video signal is inputted to the pixel. Then, voltage of the video signal is stored in the capacitor element 1402. FIGS. 17A and 17C each show a structure in which the capacitor element 1402 is provided; however, the invention is not limited thereto. When a gate capacitor or the like can be used as the capacitor that can hold a video signal, the capacitor element 1402 is not required to be provided.

The pixel shown in FIG. 17B has the same structure as that of the pixel shown in FIG. 17A except that a TFT 1406 and a scanning line 1415 are added. In the same manner, the pixel shown in FIG. 17D has the same structure as that of the pixel shown in FIG. 17C except that a TFT 1406 and a scanning line 1415 are added.

In the TFT 1406, "on" or "off" is controlled by the scanning line 1415 that is newly arranged. When the TFT 1406 is turned on, an electric charge held in the capacitor element 1402 is discharged, and the TFT 1404 is then turned off. In other words, it is possible to make a state in which current is forced not to flow through the light emitting element 1405 by arranging the TFT 1406. Therefore, the TFT 1406 can be referred to as an erasing TFT. Accordingly, in the structures in FIGS. 17B and 17D, a lighting period can be started simul-taneously with or immediately after the start of a writing period without waiting for the writing of signals in all pixels. Consequently, a duty ratio can be improved.

Figure 17E:
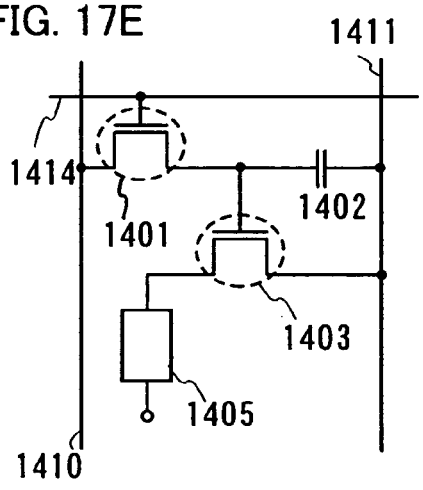
Figure 17F:
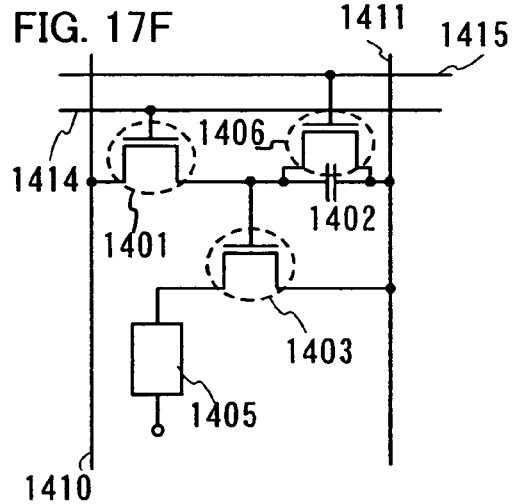

In a pixel shown in FIG. 17E, a signal line 1410 and a power supply line 1411 are arranged in a column direction, and a scanning line 1414 is arranged in a row direction. In addition, the pixel includes a switching TFT 1401, a driving TFT 1403, a capacitor element 1402, and a light emitting element 1405. A pixel shown in FIG. 17F has the same structure as that of the pixel shown in FIG. 17E except that a TFT 1406 and a scanning line 1415 are added. A duty ratio can be increased by arranging the TFT 1406 also in the structure of FIG. 17F.

As described above, various pixel circuits can be adopted. It is preferable to make a semiconductor layer of a driving TFT large, specifically, in the case of forming a thin film transistor with an amorphous semiconductor layer or the like. Therefore, the pixel circuit is preferably a top emission type, in which luminescence produced from a light emitting layer emits from the side of a sealing substrate.

Such an active-matrix display device is considered to be advantageous to low voltage driving when a pixel density is increased, since each pixel is provided with TFTs.

In this embodiment mode, an active-matrix display device in which each pixel is provided with TFTs is described. However, a passive-matrix display device in which every column is provided with TFTs can be formed. In the passive-matrix display device, TFTs are not provided for each pixel; therefore, a high aperture ratio can be obtained. In the case of a display device which emits luminescence to the both sides of a light emitting layer, transmittance can be increased by using the passive-matrix display device.

The display device having such a pixel circuit has good viewing angle dependency and can keep the characteristic of a thin film transistor and have each characteristic thereof. In addition, the manufacturing method of the invention enables such a display device to be simply manufactured with high accuracy.

The case of providing a scanning line and a signal line with a diode as a protective circuit is described with reference to an equivalent circuit shown in FIG. 17 E.

Figure 18:
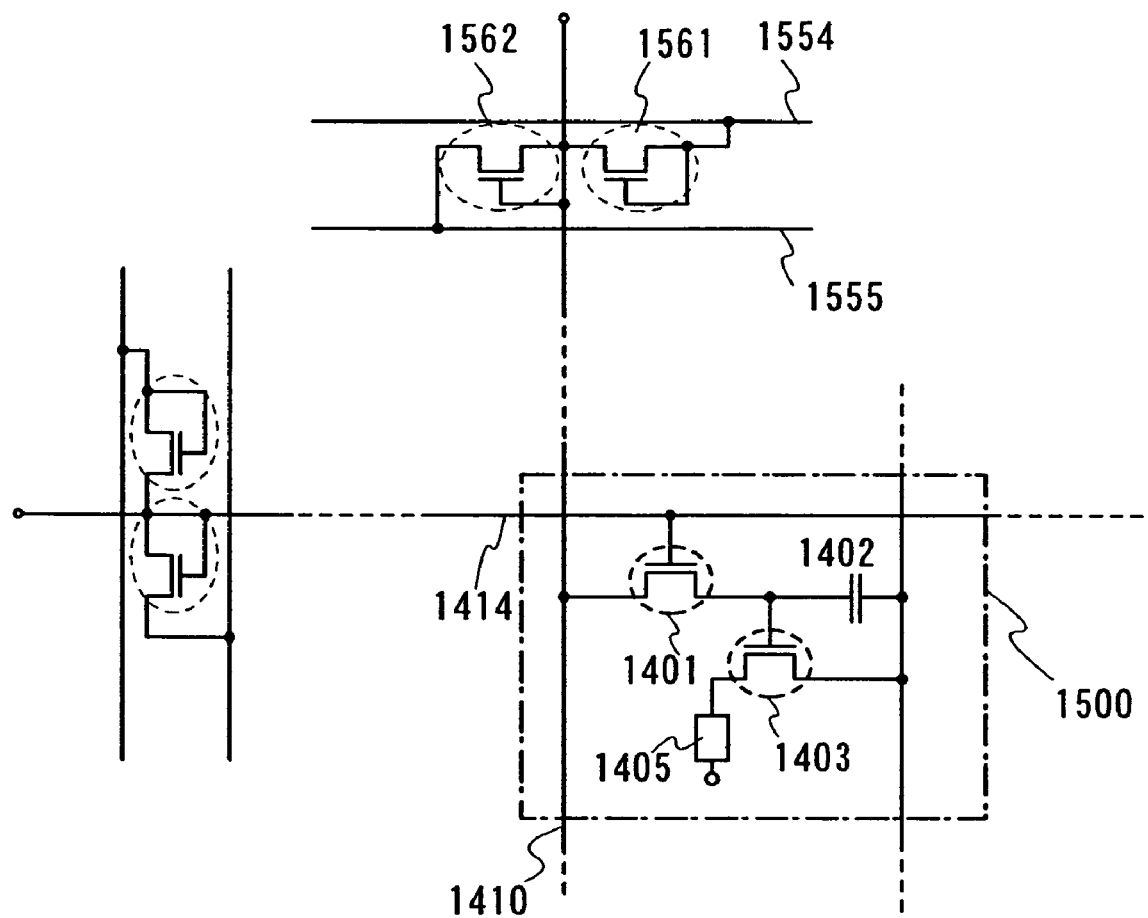
FIG. 18 illustrates a protective circuit.

In FIG. 18, a pixel portion 1500 is provided with TFTs 1401 and 1403, a capacitor element 1402, and a light emitting element 1405. A signal line 1410 is provided with diodes 1561 and 1562. The diodes 1561 and 1562 are manufactured according to the above embodiment mode as in the case of the TFT 1401 or 1403 and include a gate electrode, a semiconductor layer, a source electrode, a drain electrode, and the like. The diodes 1561 and 1562 operate by connecting the gate electrode to the drain electrode or the source electrode.

Common potential lines 1554 and 1555 connected to the diodes are formed in the same layer as the gate electrode. Therefore, a contact hole needs to be formed in a gate insulating layer to connect the gate electrode to the source electrode or the drain electrode of the diode.

A diode provided for a scanning line 1414 has a similar structure.

Thus, a protective diode provided for an input portion can be simultaneously formed. Note that a position where the protective diode is formed is not limited thereto, and the protective diode can be provided between a driver circuit and a pixel.

The display device having such a protective circuit has good viewing angle dependency and may keep the characteristic of a thin film transistor and enhance the reliability as a display device. In addition, the manufacturing method of the invention may enable such a display device to be simply manufactured with high accuracy.

Embodiment Mode 11

Figure 19A:
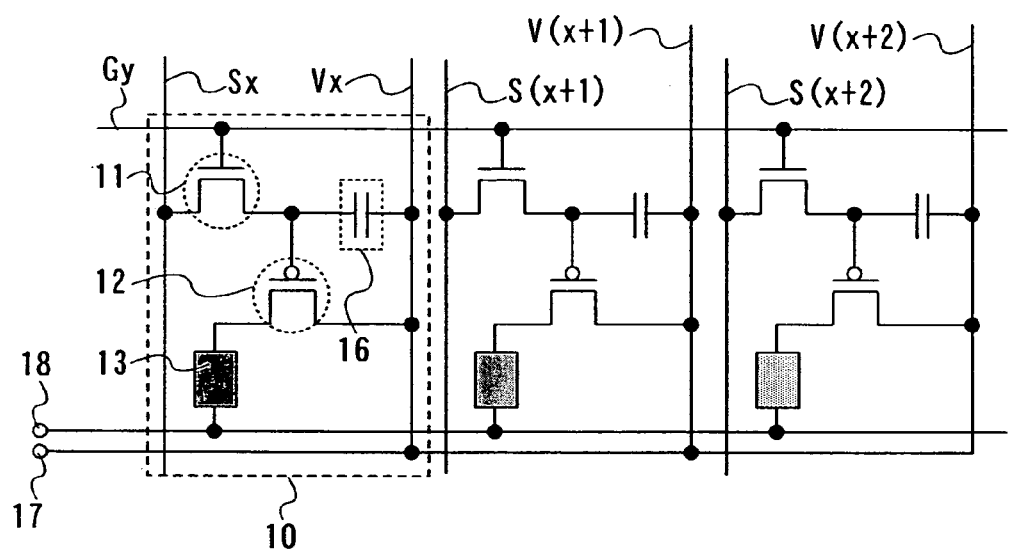
FIGS. 19A and 19B illustrate an example of a display device manufactured by a method for manufacturing a display device according to the invention.

The structure of a display device manufactured according to of the invention is described below with reference to FIGS. 19A to 19B and 20. Each cross-sectional view of FIGS. 1 to 4 corresponds to a line B-C of FIG. 20. The display device of the invention comprises a plurality of pixels 10 each including a plurality of elements in the region where a source line Sx (x is a natural number, and $1 \leq x \leq m$ is satisfied) and a gate line Gy (y is a natural number, and $1 \leq y \leq n$ is satisfied) cross each other with an insulator interposed therebetween (see FIG. 19A). The pixel 10 includes a light emitting element 13, a capacitor 16 and two transistors. One of the two transistors is a switching transistor 11 (hereinafter also referred to as a TFT 11) for controlling a video signal input to the pixel 10 and a driving transistor 12 (hereinafter also referred to as a TFT 12) for controlling emission/non-emission of the light emitting element 13. Each of the TFTs 11 and 12 is a field effect transistor that has three terminals of a gate electrode, a source electrode, and a drain electrode.

The gate electrode of the TFT 11 is connected to a gate line Gy, and one of the source electrode and the drain electrode thereof is connected to a source line Sx while the other thereof is connected to the gate electrode of the TFT 12. One of the source electrode and the drain electrode of the TFT 12 is connected to a first power source 17 through a power source line Vx (x is a natural number, and $1 \leq x \leq m$ is satisfied) while the other thereof is connected to a pixel electrode of the light emitting element 13. A counter electrode of the light emitting element 13 is connected to a second power source 18. The capacitor 16 is disposed between the gate electrode and the source electrode of the TFT 12. The conductivity of the TFTs 11 and 12 is not limited, and either of an N-channel TFT and a P-channel TFT may be employed. The illustrated structure shows the case where the TFT 11 is an N-channel TFT and the TFT 12 is a P-channel TFT. Potentials of the first power source 17 and the second power source 18 are not limited. However, they are only required to be set at different potentials so that a forward bias voltage or a reverse bias voltage is applied to the light emitting element 13.

Figure 20:
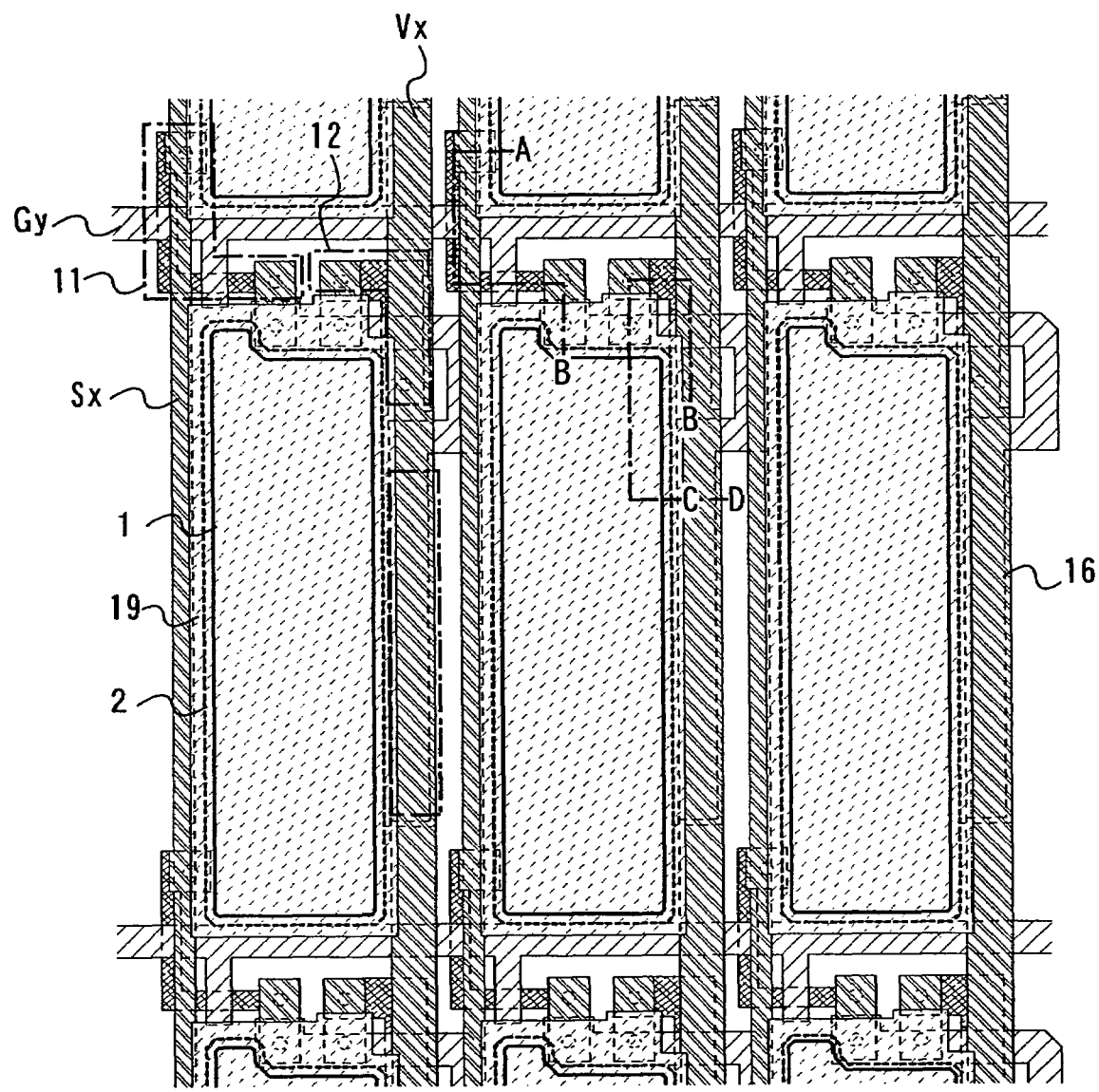
FIG. 20 illustrates a top view of a display device manufactured by a method for manufacturing a display device according to the invention.

FIG. 20 shows the pixels 10 having the above configuration. The TFTs 11 and 12, the capacitor 16, a first electrode 19 that corresponds to the pixel electrode of the light emitting element 13, a portion (bank opening portion) 1 connecting a light emitting layer 33 and the first electrode 19, and an opening portion 2 which is formed in three layers of a hydrogenation film, a gate insulating film, and the second base insulating film are shown. Note that the inner edge of the opening portion 2 is preferably formed in the outer side of the inner edge of the bank opening portion 1; however, even if it is formed on the inner side thereof when there is difficulty in layout, a certain effect can be obtained.

Figure 19B:
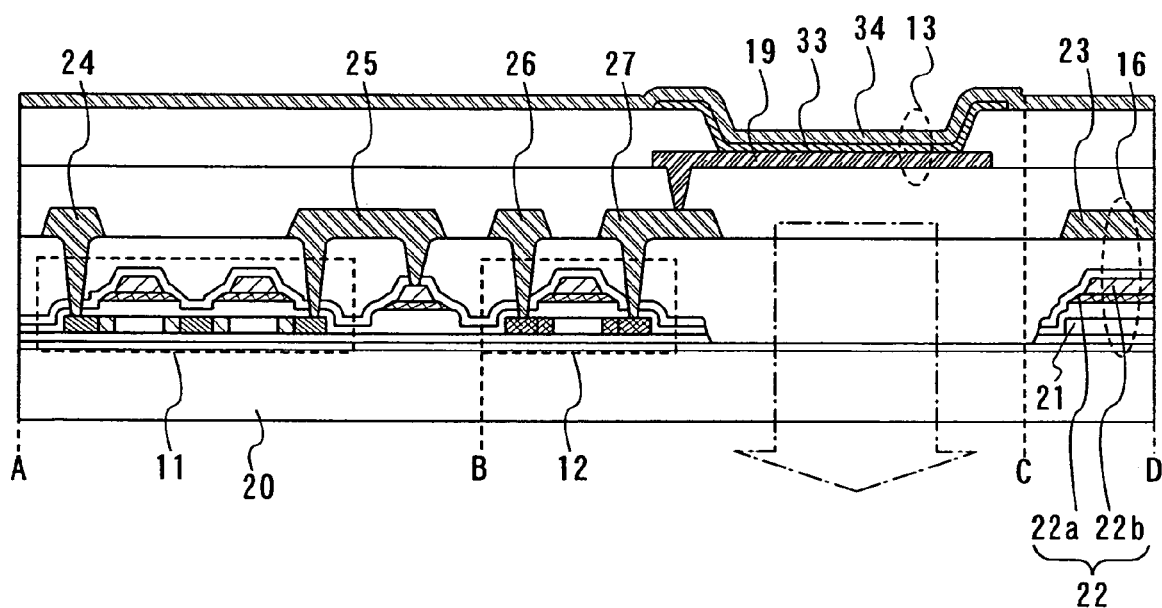

FIG. 19B shows a cross-sectional structure of the layout in FIG. 20 along a line A-B-C. The TFTs 11 and 12, the light emitting element 13, and the capacitor 16 are formed over a substrate 20 having an insulating surface such as glass and quartz.

The light emitting element 13 corresponds to stacked layers of the first electrode 19, a light emitting layer 33, and a second electrode 34. When both of the first electrode 19 and the second electrode 34 transmit light, the light emitting element 13 emits luminescence in both directions of the first electrode 19 and the second electrode 34. That is, the light emitting element 13 emits light to both sides. On the other hand, when one of the first electrode 19 and the second electrode 34 transmits light while the other shields light, the light emitting element 13 emits light only in the direction of the first electrode 19 or the second electrode 34. That is, the light emitting element 13 emits light to the top side or the bottom side. FIG. 19B shows a cross-sectional structure in the case where the light emitting element 13 emits light to the bottom side.

The capacitor 16 is disposed between the gate electrode and the source electrode of the TFT 12 and stores a gate-source voltage of the TFT 12. The capacitor 16 forms a capacitance by a semiconductor layer 21 provided in the same layer as the semiconductor layers included in the TFTs 11 and 12, conductive layers 22a and 22b (hereinafter collectively referred to as a conductive layer 22) provided in the same layer as the gate electrodes of the TFTs 11 and 12, and an insulating layer provided between the semiconductor layer 21 and the conductive layer 22. Also, the capacitor 16 forms a capacitance by the conductive layer 22 provided in the same layer as the gate electrodes of the TFTs 11 and 12, a conductive layer 23 provided in the same layer as conductive layers 24 to 27 that are connected to the source electrode or the drain electrode of the TFTs 11 and 12, and an insulating layer provided between the conductive layer 22 and the conductive layer 23. According to such a structure, the capacitor 16 can have a capacitance value large enough to store the gate-source voltage of the TFT 12. In addition, the capacitor 16 is provided below the conductive layer constituting a power source line, therefore, the layout of the capacitor 16 does not decrease the aperture ratio.

The conductive layers 23 to 27 each corresponding to the source/drain wiring of the TFTs 11 and 12 are 500 to 2000 nm thick, or more preferably, 500 to 1300 nm thick. The conductive layers 23 to 27 constitute the source line Sx and the power source line Vx. Therefore, by forming the conductive layers 23 to 27 to be thick as described above, an effect of a voltage drop can be suppressed. Note that when forming the conductive layers 23 to 27 to be thick, wiring resistance can be made small. However, when forming the conductive layers 23 to 27 to be extremely thick, it becomes difficult to perform a patterning process accurately or the surface will have more irregularity. That is, the thickness of the conductive layers 23 to 27 is desirably controlled within the above range in consideration of the wiring resistance, the patterning process to be performed easily and irregularity of the surface.

Embodiment 1

Figure 21:
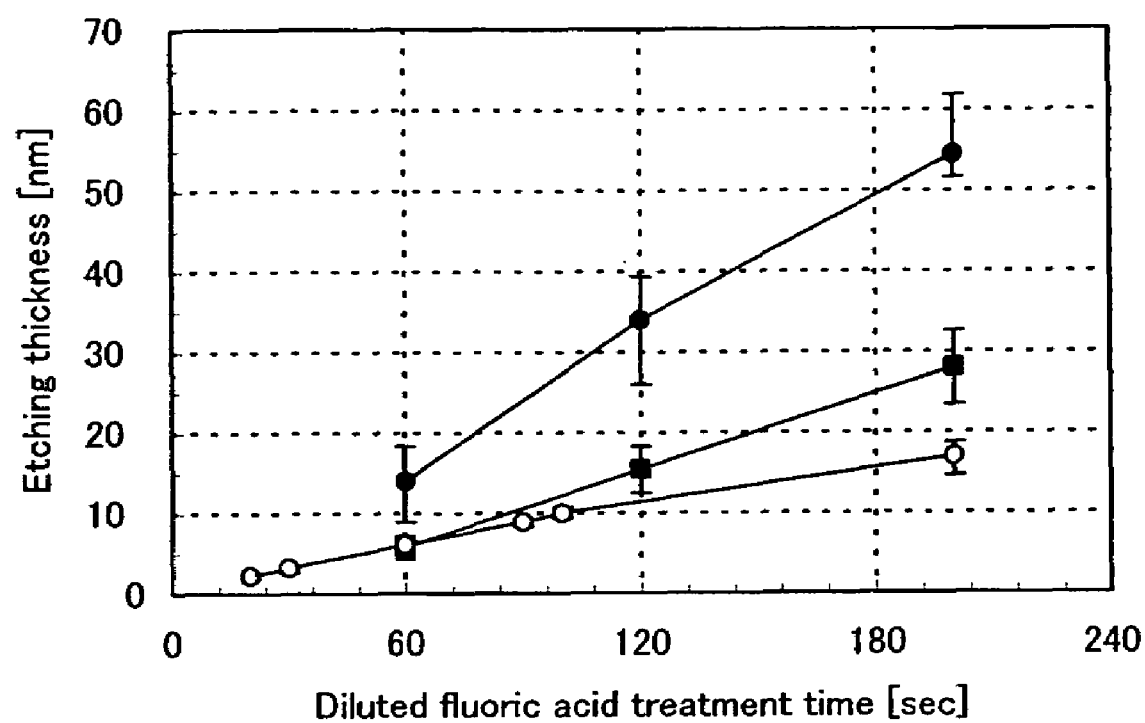
FIG. 21 shows a dope amount and an etching rate.

FIG. 21 shows a rate of an etching rate in doping silicon oxide with impurities.

A silicon oxide film which is formed using a mixing gas of TEOS (tetraethoxysilane)/$O_2$ by a plasma CVD method is etched by diluted hydrofluoric acid of 0.5%, thereby showing the result thereof in FIG. 21. Reference ○ means a silicon oxide film which is not doped; reference • means a silicon oxide film which is doped with boron; and reference ■ means a silicon oxide film which is doped with phosphorous. The dose amount of phosphorous is $1.5 \times 10^{15}$ atoms/cm$^2$ and that of boron is 0.8 to $1.6 \times 10^{15}$ atoms/cm$^2$ in terms of the number of atoms in doping. In addition, in a reference, doping with impurities is not conducted.

In the result, the etching speed of a silicon oxide film doped with phosphorous is 16 nm/min; the etching speed of a silicon oxide film doped with boron is 9 nm/min; and the etching speed of a silicon oxide film undoped with impurities in the reference is 5 nm/min. In other words, the etching speed of the silicon oxide film doped with phosphorous is three times faster than that of the silicon oxide film in the reference, and the etching speed of the silicon oxide film doped with boron is twice faster than the silicon oxide film in the reference.

As described above, the etching speed can be changed by doping the silicon oxide film with such impurities.

The present application is based on Japanese Priority Application No. 2004-145709 filed on May 14, 2004 with the Japanese Patent Office, the entire contents of which are hereby incorporated by reference.

What is claimed is:

1. A method for manufacturing a display device, comprising the steps of:
   forming a first base insulating film over a substrate;
   forming a second base insulating film over the first base insulating film;
   forming a semiconductor layer over the second base insulating film;
   forming a gate insulating film over the semiconductor layer;
   forming a gate electrode over the gate insulating film to overlap with at least a portion of the semiconductor layer;
   doping portions of the gate insulating film and the second base insulating film with at least one conductive type impurity;
   forming an opening portion by etching at least a part of the portions of the gate insulating film and the second base insulating film to expose the first base insulating film;
   simultaneously forming a contact hole different from the opening portion reaching the semiconductor layer in the gate insulating film with the step of forming the opening portion;
   forming an interlayer insulating film to cover the opening portion, the gate insulating film, and the gate electrode; and
   forming a light emitting element over the interlayer insulating film to overlap with at least a part of the opening portion.

2. The method for manufacturing a display device according to claim 1,
   further comprising a step of forming a silicon nitride based film over the gate insulating film and the gate electrode,
   wherein the interlayer insulating film is formed after forming the silicon nitride based film and
   wherein a portion of the silicon nitride based film is etched by forming the opening portion.

3. The method for manufacturing a display device according to claim 1,
   wherein the first base insulating film comprises silicon nitride.

4. The method for manufacturing a display device according to claim 1,
   wherein the gate insulating film is formed by stacking a first insulating material and sequentially stacking a second insulating material.

5. The method for manufacturing a display device according to claim 4,
   wherein the second insulating material comprises silicon nitride.

6. The method for manufacturing a display device according to claim 1,
   wherein the etching is conducted using a hydrofluoric acid based chemical.

7. The method for manufacturing a display device according to claim 6,
   wherein the hydrofluoric acid based chemical is buffered hydrogen fluoride or diluted hydrofluoric acid.

8. The method for manufacturing a display device according to claim 1,
   wherein each of the second base insulating film and the gate insulating film comprises silicon oxide.

9. The method for manufacturing a display device according to claim 1,
   wherein the semiconductor layer is simultaneously doped with at least the one conductive type impurity in the doping step.

10. The method for manufacturing a display device according to claim 1, wherein the first base insulating film is formed using a silicon nitride.

11. A method for manufacturing a display device, comprising the steps of:
    forming a first base insulating film over a substrate;
    forming a second base insulating film over the first base insulating film;
    forming a semiconductor layer over the second base insulating film;
    forming a gate insulating film over the semiconductor layer;
    forming a gate electrode over the gate insulating film to overlap with at least a portion of the semiconductor layer;
    doping portions of the gate insulating film and the second base insulating film with at least one conductive type impurity;
    forming a first insulating film to cover the gate electrode and the gate insulating film;
    forming a mask over the first insulating film;
    forming an opening portion by etching at least a part of the portions of the gate insulating film and the second base insulating film in accordance with the mask to expose the first base insulating film;
    simultaneously forming a contact hole different from the opening portion reaching the semiconductor layer in the gate insulating film with the step of forming the opening portion;
    forming a second insulating film to cover the opening portion, and the first insulating film; and
    forming a light emitting element over the second insulating film to overlap with at least a part of the opening portion.

12. The method for manufacturing a display device according to claim 11,
    further comprising a step of forming a silicon nitride based film over the gate insulating film and the gate electrode,
    wherein the first insulating film is formed after forming the silicon nitride based film and
    wherein a portion of the silicon nitride based film is etched by forming the opening portion.

13. The method for manufacturing a display device according to claim 11,
    wherein the first base insulating film comprises silicon nitride.

14. The method for manufacturing a display device according to claim 11,
    wherein the gate insulating film is formed by stacking a first insulating material and sequentially stacking a second insulating material.

15. The method for manufacturing a display device according to claim 14,
    wherein the second insulating material comprises silicon nitride.

16. The method for manufacturing a display device according to claim 11,
    wherein the etching is conducted using a hydrofluoric acid based chemical.

17. The method for manufacturing a display device according to claim 16,
wherein the hydrofluoric acid based chemical is buffered hydrogen fluoride or diluted hydrofluoric acid.

18. The method for manufacturing a display device according to claim 11,
wherein each of the second base insulating film and the gate insulating film comprises silicon oxide.

19. The method for manufacturing a display device according to claim 11,
wherein the semiconductor layer is simultaneously doped with at least the one conductive type impurity in the doping step.

20. The method for manufacturing a display device according to claim 11, wherein the first base insulating film is formed using a silicon nitride.

21. A method for manufacturing a display device, comprising the steps of:
forming a first base insulating film over a substrate;
forming a second base insulating film over the first base insulating film;
forming a semiconductor layer over the second base insulating film;
forming a gate insulating film over the semiconductor layer;
forming a gate electrode over the gate insulating film to overlap with at least a portion of the semiconductor layer;
doping portions of the gate insulating film and the second base insulating film with at least one conductive type impurity;
forming an opening portion by etching at least a part of the portions of the gate insulating film and the second base insulating film to expose the first base insulating film;
simultaneously forming a contact hole different from the opening portion reaching the semiconductor layer in the gate insulating film with the step of forming the opening portion;
forming an interlayer insulating film to cover the opening portion, the gate insulating film, and the gate electrode;
forming a wiring electrically connected to the semiconductor layer; and
forming a light emitting element over the interlayer insulating film to overlap with at least a part of the opening portion, the light emitting element being electrically connected to the wiring.

22. The method for manufacturing a display device according to claim 21,
wherein the first base insulating film comprises silicon nitride.

23. The method for manufacturing a display device according to claim 21,
wherein the gate insulating film is formed by stacking a first insulating material and sequentially stacking a second insulating material.

24. The method for manufacturing a display device according to claim 23,
wherein the second insulating material comprises silicon nitride.

25. The method for manufacturing a display device according to claim 21,
wherein etching is conducted using a hydrofluoric acid based chemical.

26. The method for manufacturing a display device according to claim 25,
wherein the hydrofluoric acid based chemical is buffered hydrogen fluoride or diluted hydrofluoric acid.

27. The method for manufacturing a display device according to claim 21,
wherein each of the second base insulating film and the gate insulating film comprises silicon oxide.

28. The method for manufacturing a display device according to claim 21,
wherein the semiconductor layer is simultaneously doped with at least the one conductive type impurity in the doping step.

29. The method for manufacturing a display device according to claim 21, wherein the first base insulating film is formed using a silicon nitride.

* * * * *